United States Patent
Umehara et al.

(10) Patent No.: US 6,229,307 B1
(45) Date of Patent: May 8, 2001

(54) MAGNETIC SENSOR

(75) Inventors: Tamio Umehara; Akio Takayama; Hideki Kato; Akiyo Yuguchi, all of Iwata-gun (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/372,754

(22) Filed: Aug. 11, 1999

(30) Foreign Application Priority Data

Aug. 12, 1998 (JP) .................................................. 10-228451
Mar. 31, 1999 (JP) .................................................. 11-091382

(51) Int. Cl.⁷ ............................. G01R 33/02; G11B 5/127
(52) U.S. Cl. ........................ 324/249; 324/260; 324/244; 360/110
(58) Field of Search ...................................... 324/249, 256, 324/253, 255, 244, 260, 173, 207.13, 235; 360/110

(56) References Cited

U.S. PATENT DOCUMENTS

| | | | |
|---|---|---|---|
| 5,764,055 | * | 6/1998 | Kawase .................................. 324/249 |
| 5,831,432 | * | 11/1998 | Mohri .................................... 324/249 |
| 5,877,706 | * | 3/1999 | Summersgill ........................... 340/933 |

FOREIGN PATENT DOCUMENTS

| | | |
|---|---|---|
| 6-176930 | 6/1994 | (JP) . |
| 6-347489 | 12/1994 | (JP) . |
| 7-181239 | 7/1995 | (JP) . |
| 7-248365 | 9/1995 | (JP) . |
| 7-333305 | 12/1995 | (JP) . |
| 8-75835 | 3/1996 | (JP) . |
| 11014643 | * 6/1997 | (JP) . |

OTHER PUBLICATIONS

T. Morikawa et al. "Thin–Film GMI Elements with High Sensitivity" Japanese Applied Magnetic Institute Journal, vol. 20, No. 2, 1996, pp. 553–556.

T. Gunji et al. "Asymmetrical Magneto–Impedance Effect in an Amorphous Wire with a Coil" Japan Applied Magnetic Society, vol. 21, No. 4–2, 1997, pp. 793–796.

* cited by examiner

Primary Examiner—Christine Oda
Assistant Examiner—Anthony Jolly
(74) Attorney, Agent, or Firm—Oliff & Berridge, PLC

(57) ABSTRACT

A magnetic sensor includes: an oscillating circuit for allowing an a.c. magnetic field into a magnetic impedance element made of a ferromagnetic substance, having first and second electrodes on both ends thereof in a longitudinal direction thereof and having a structure in which a bias coil and a negative feedback coil are wound around the ferromagnetic substance through an insulator; a detecting circuit for detecting an a.c. voltage of the magnetic impedance element due to a change in the impedance of the magnetic impedance element which is caused by an applied external magnetic field; a peak holding circuit for holding the peak value of the output voltage of the detecting circuit; and an amplifying circuit for differentially amplifying the output of the peak holding circuit.

14 Claims, 26 Drawing Sheets

F I G .19
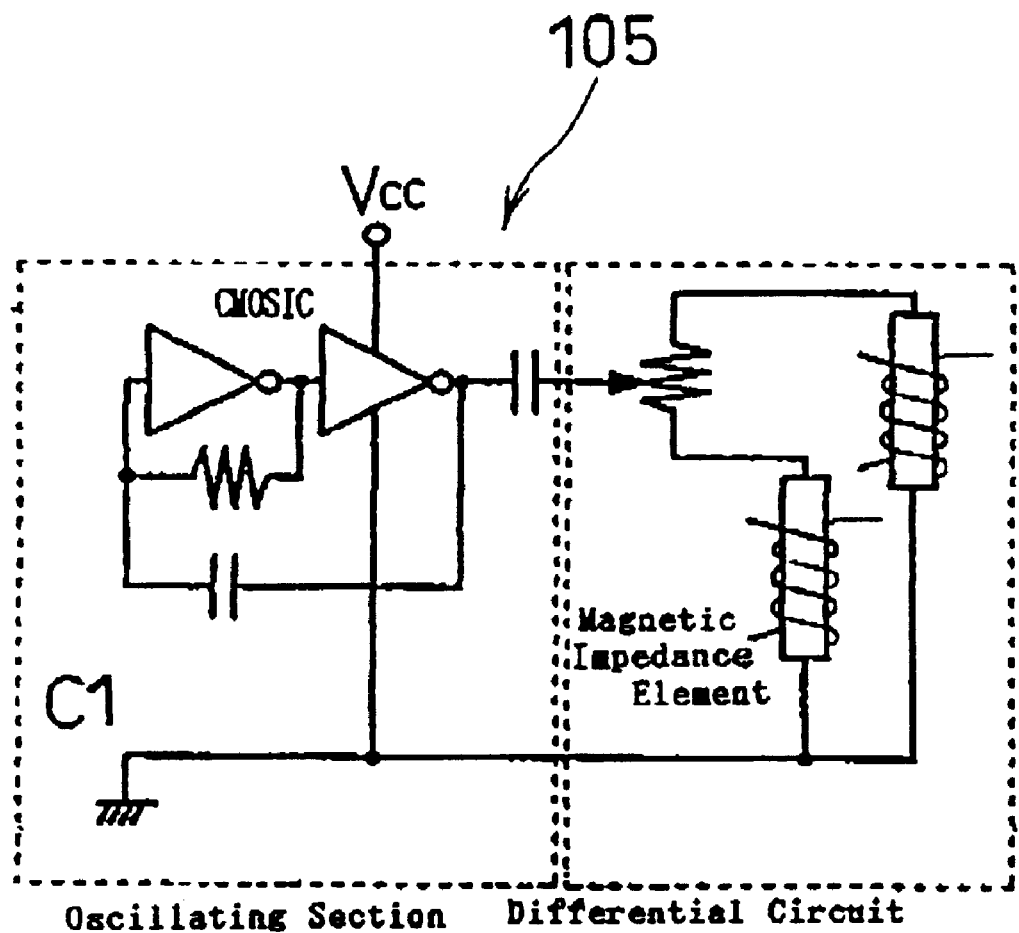

F I G. 25
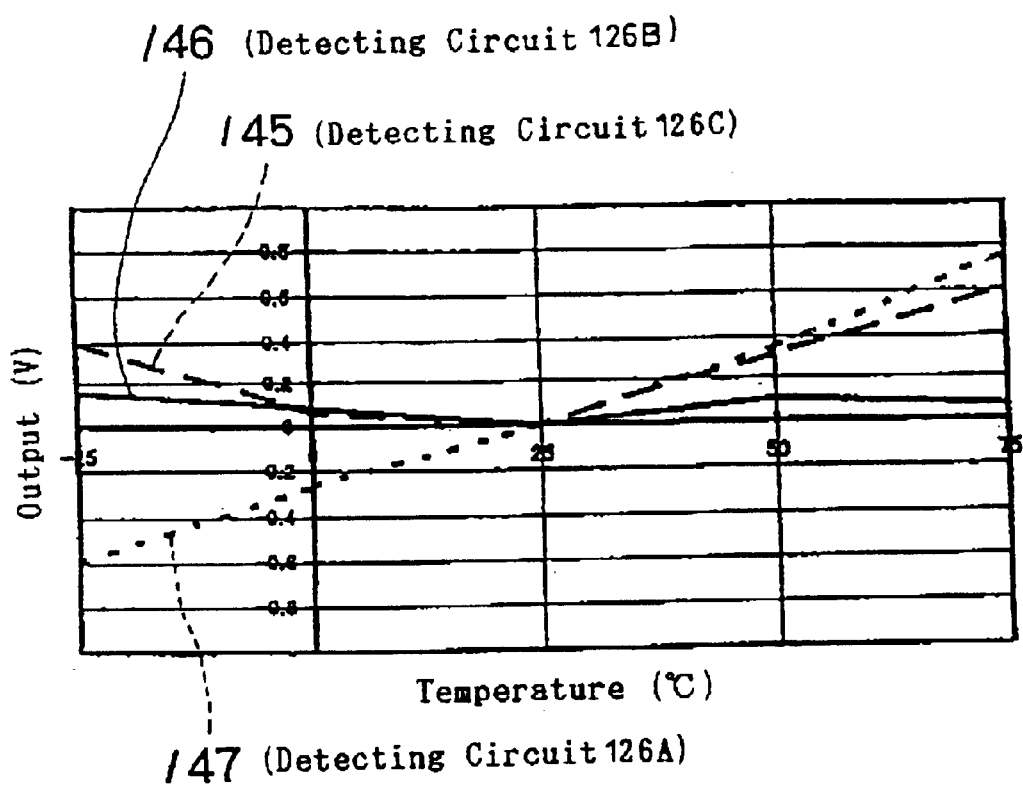

MAGNETIC SENSOR

BACKGROUND OF THE INVENTION

1. Field of the Invention

The present invention relates to & magnetic sensor, and more particularly, to a magnetic impedance sensor which is a high-sensitive magnetic sensor.

2. Description of the Related Art

With the recent rapid development of information devices and measuring and control devices, demand of magnetic sensors which are small sizes, low costs, high in sensitivity and high in response have increased more and more. For example, in a hard disc device of an external memory device for a computer, a high performance has been advanced such that an induction type magnetic head of the bulk type has been changed to a thin film magnetic head or a magnetic resistance effect (MR) head. Since in a rotary encoder which is a rotary sensor for use. in a motor, the number of magnetic poles is increased, there has been required a magnetic sensor which is capable of detecting a fine surface magnetic flux with a high sensitivity instead of the conventional magnetic resistance effect (MR) sensor. Also, demand of a high-sensitive magnetic sensor which can be used for a non-destructive investigation or a bill investigation has increased more and more. Similarly, demand of a small-sized and light-weight azimuth sensor for an automobile, an active magnetic shield sensor for a display tube in a high-accuracy color television or a personal computer, and so on have increased more and more.

As the representative magnetic sensors which are now being used, there are an induction type reproduction magnetic head. a magnetic resistance effect (MR) element, a flux gate sensor, a Hall element and so on. Also, in recent years, there have been proposed magnetic sensors with high sensitivity employing the magnetic impedance effect of an amorphous wire (refer to Japanese Patent Laid-open Publication No. Hei 6-176930, Japanese Patent Laid-open Publication No. Hei 7-181239 and Japanese Patent Laid-open Publication No. Hei 7-333305) and the magnetic impedance effect of a magnetic thin film (refer to Japanese Patent Laid-open Publication No. Hei 8-75835, Japanese Applied Magnetic Institute Journal, vol. 20,553–556 (1996)).

The induction type reproduction magnetic head suffers from such problems that a magnetic head per se is large-sized because a coil winding is required, and also that the sensitivity of detection is remarkably deteriorated because a relative speed between the magnetic head and a medium is low when the induction-type magnetic head is miniaturized. For solving the above problems, the magnetic resistance effect (MR) element using a ferromagnetic film is being employed. The MR element is so designed as to detect not a temporal variation in magnetic flux but the magnetic flux per se, to thereby advance the miniaturizing of the magnetic head. However, in the existing MR element, the rate of change in the electric resistance is about 2%, and even in the MR element using the spin valve element, the rate of change in the electric resistance is small to the degree of 6% or less at the maximum. Also, the external magnetic field necessary for obtaining the in resistance of several % is large to the degree of 1600 A/m or more. Therefore, the magnetic resistance sensitivity is low to the degree of 0.001%/(A/m) or less. Also, in recent years, there has been found a giant magnetic resistance effect (GMR) due to an artificial lattice in which the rate of change in the magnetic resistance is several tens %. However, in order to obtain the change in resistance of several tens %, the external magnetic field of several ten thousands A/m is necessary, and therefore the practical use of the magnetic resistance element as a magnetic sensor has not been realized.

The flux gate sensor which is the conventional high-sensitivity magnetic sensor is so designed as to measure the magnetism by using the phenomenon in which the symmetric B-H characteristic of a high permeability magnetic core such as a permalloy is changed according to the external magnetic field, and has the high resolution and the high directivity of ±1°. However, the above flux gate sensor suffers from such problems that a large-sized magnetic core that is small in diamagnetic field is required in order to enhance the sensitivity of detection, thereby making it difficult to reduce the dimensions of the entire sensor and also that the power consumption is large.

The magnetic sensor using a hole element is a sensor using a phenomenon in which when a magnetic field is applied perpendicularly to a surface of the sensor into which a current flows, an electric field is developed in a direction perpendicular to both of the current flowing direction and the magnetic field applying direction. to thereby induce an electromotive force in the hole element. The hole element is advantageous from the viewpoint of the costs but has such defects that the sensitivity of the magnetic field detection is low and that the temperature characteristic of the magnetic field sensitivity is low because the mobility of electrons or positive holes is changed by diffusion of lattices within the semiconductor due to thermal vibrations to a change in temperature since the hole element is made of semiconductor such as Si or GaAs.

Japanese Patent Laid-open Publication No. Hei 6-176930, Japanese Patent Laid-open Publication No. Hei 7-181239 and Japanese Patent Laid-open Publication No. Hei 7-333305 have proposed therein magnetic impedance elements by which a great improvement in the magnetic field sensitivity has been realized. The magnetic impedance element is a magnetic impedance element that has a basic principle in which only a voltage caused when a circumferential magnetic flux changes as a time elapses, using the skin effect that is produced when a current which rapidly varies as a time elapses is supplied to a magnetic line is detected as a change caused by the externally applied magnetic field. An amorphous wire (a wire which has been tension-annealed after having been drawn) which is made of FeCoSiB or the like and about 30 $\mu$m in the diameter of exciting distortion is employed as a magnetic line. Even in a wire having a fine dimension of about 1 m in length, when a high-frequency current of about 1 MHz is supplied to the wire, the amplitude of a voltage across the wire changes with the high sensitivity of about 0.1%/(A/m) which is more than 100 times as large as that of the MR element.

Incidentally, as the magnetic sensor, there has been demanded a high-sensitive magnetic sensor which is small size, low costs and excellent in the linearity and the temperature characteristic of an output to the detected magnetic field (external magnetic field) The magnetic sensor using the magnetic impedance effect of the amorphous wire exhibits the magnetic field detection characteristic of a high sensitivity.

Also, Japanese Patent Laid-open Publication No. Hei 6-176930 and Japanese Patent Laid-open Publication No. Hei 6-347489 disclose that the application of a bias magnetic field allows the linearity of the dependency of the applied magnetic field of the impedance change to be improved, and that a negative feedback coil is wound on the amorphous wire, and a voltage between both ends of the amorphous wire is amplified and a negative feedback current is allowed to flow into a negative feedback coil, thereby being capable of providing a magnetic sensor which is excellent in linearity.

Incidentally, Japanese Patent Laid-open Publication No.Hei 6-176930 fails to teach a drive circuit including an oscillating circuit and a detecting circuit, and Japanese Patent Laid-open Publication No. Hei 6-347489 has proposed the combination of a multi-vibrator using a pair of switching transistors with a low-pass filter as an oscillating circuit. Also, Japan Applied Magnetic Society, vol.21. 793–796 (1997) discloses that in order to reduce power consumption, a high-frequency current is applied to amorphous wires by a pulse drive using a C-MOS multi-vibrator, and the respective amorphous wires are detected by diodes to differentially amplify the detected results by the operation amplifier. However, in the circuit of this type, the amount of a magnetic change in the magnetic impedance is not extracted at the maximum, resulting in a problem in view of the temperature characteristic.

A technique using two amorphous wires is disclosed in Japanese Patent Laid-open Publication No. Hei 7-248365. but this publication does not teach a drive circuit including a detecting circuit.

SUMMARY OF THE INVENTION

The present invention has been made in view of the above circumstances, and therefore an object of the present invention is to provide a magnetic sensor which is excellent in the linearity and the temperature characteristic of an output to the detected magnetic field, high in sensitivity and small in size.

In order to achieve the above object of the present invention, according to a first aspect of the. present invention, there is provided a magnetic sensor, characterized by comprising: an oscillating circuit for supplying an a.c. current into a magnetic impedance element made of a ferromagnetic substance, having first and second electrodes on both ends thereof in a longitudinal direction thereof and having a structure in which a bias coil and a negative feedback coil are wound around the ferromagnetic substance through an insulator; a detecting circuit for detecting an a.c. voltage of the magnetic impedance element due to a change in the impedance of the magnetic impedance element which is caused by an applied external magnetic field; a peak holding circuit for holding the peak value of the output voltage of the detecting circuit; and an amplifying circuit for differentially amplifying the output of the peak holding circuit.

According to a second aspect of the present invention, there is provided a magnetic sensor. characterized by comprising; two magnetic impedance elements each made of a ferromagnetic substance, having first and second electrodes on both ends thereof in a longitudinal direction thereof and having a structure in which a bias coil and a negative feedback coil are wound around the ferromagnetic substance through an insulator; an oscillating circuit for supplying an a.c. current into the two magnetic impedance elements; a circuit for supplying a d.c. current to the bias coils of the two magnetic ism ce elements so that opposite magnetic fields are applied to the two magnetic impedance elements; a detecting circuit for detecting an a.c. voltage between the first electrode and the second electrode of the magnetic impedance element due to the respective changes of the impedances of the two magnetic impedance elements which is caused by am applied external magnetic field; a peak holding circuit for holding the peak value of the output voltage of the detecting circuit; and an amplifying circuit for differentially amplifying the output of the peak holding circuit of the respective magnetic impedance elements.

According to a third aspect of the present invention, there is provided a magnetic sensor as defined in the first or second aspect, characterized in that: the magnetic impedance element includes a substrate formed of a non-magnetic substance; a ferromagnetic thin-film magnetic core formed on the substrate; and first and second electrodes disposed on both ends of the ferromagnetic thin-film magnetic core in a longitudinal direction thereof; and that the bias coil and the negative feedback coil are wound around the ferromagnetic thin film magnetic core through an insulator.

According to a fourth aspect of the present invention, there is provided a magnetic sensor as defined in the first or second aspect of the present invention, characterized in that: the magnetic impedance element includes a ferromagnetic amorphous wire and first and second electrodes disposed on both ends of the ferromagnetic amorphous wire in a longitudinal direction thereof; and that the bias coil and the negative feedback coil are wound around the ferromagnetic amorphous wire through an insulator.

The oscillator as defined in fifth to eighth aspects of the present invention can be driven by any one of a pulse wave and a sinusoidal wave. One example of circuits that generate a pulse wave voltage consists two types of circuit (circuit 1 and circuit 2). Circuit 1 contains a C-MOS, and a resistor and a capacitor, and it oscillates a rectangular wave voltage. By applying the output voltage oscillated by circuit 1 to circuit 2 (the differential circuit), a pulse wave voltage can be obtained through the conversion. The following three type of circuits are the representative ones that generate sinusoidal wave voltage. Circuit 1 contains a C-MOS and a crystal oscillator, and it oscillates a rectangular wave voltage, and after that, it makes the oscillated rectangular wave voltage pass through the low pass filter or band pass filter, and as a result, it outputs a sinusoidal wave voltage. Circuit 2 makes up Wien's bridge oscillator with the operational amplifier. Circuit 3 is called a cascade type Colpitts circuit which uses a crystal oscillator.

According to a ninth aspect of the present invention, there is provided a magnetic sensor as defined in the first aspect of the present invention, in which a constant current is allowed to flow into the diode of the detecting circuit, a peak holding circuit for detecting both of the positive side and the negative side of the voltage is formed, and a differential amplification is made to provide a high detection capability.

According to a tenth aspect of the present invention, similarly to the ninth aspect of the present invention, there is provided a magnetic sensor as defined in the second aspect of the present invention, in which a constant current is allowed to flow into the diode of the detecting circuit, both of the a.c. voltage of the positive side and the negative side are detected to en e the detection capability, and both of the detected outputs are synthesized so as to be added together, and differentially amplified to remove the temperature characteristic of the diode.

In the magnetic sensor as defined in the first or second aspect of the present invention, the oscillating circuit comprises a generator which is formed of a C-MOS and a differentiating circuit and is high in stability.

BRIEF DESCRIPTION OF THE DRAWINGS

These and other objects, features and advantages of this invention will become more fully apparent from the following detailed description taken with the accompanying drawings in which:

FIG. 19 is a circuit diagram showing a first example of um oscillating circuit shown in FIG. 18;

FIG. 25 is a graph showing the temperature to output characteristic of the detecting circuit shown in FIGS. 22, 24 end 28;

DETAILED DESCRIPTION OF THE PREFERRED EMBODIMENTS

Now, a description will be given in more detail of preferred embodiments of the present invention with reference to the accompanying drawings.

A first embodiment of the present invention will be described with reference to FIG. 1.

Figure 1:
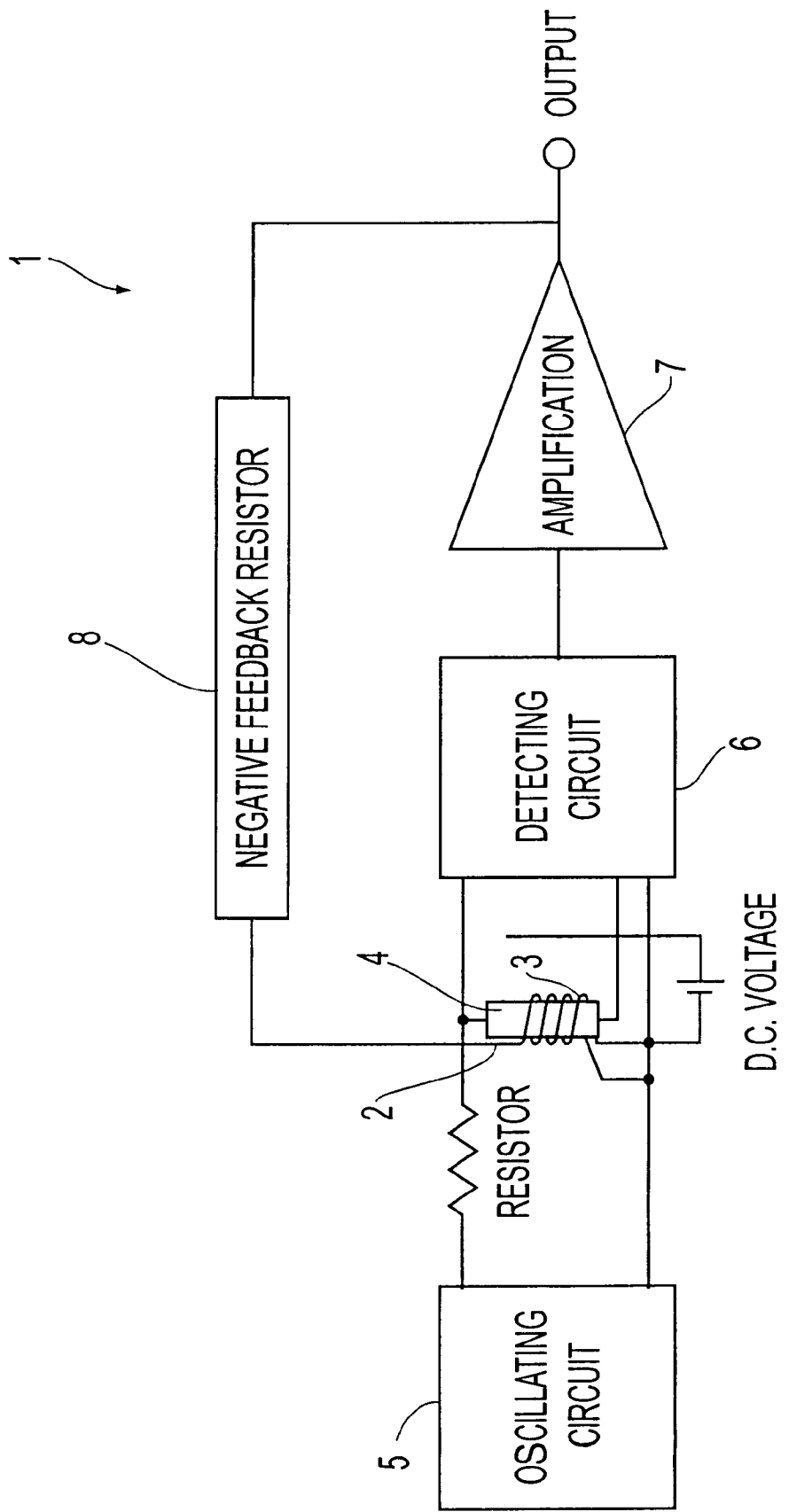
FIG. 1 is a circuit diagram schematically showing a magnetic sensor in accordance with a first embodiment of the present invention.

FIG. 1 is a block diagram stowing the circuit structure of a magnetic sensor 1 in accordance with the present invention. The magnetic sensor 1 includes a magnetic impedance element 4 having a negative feedback coil 2 and a bias coil 3. an oscillating circuit S, a detecting circuit 6, an amplifying circuit 7 and a negative feedback resistor 8.

Figure 2:
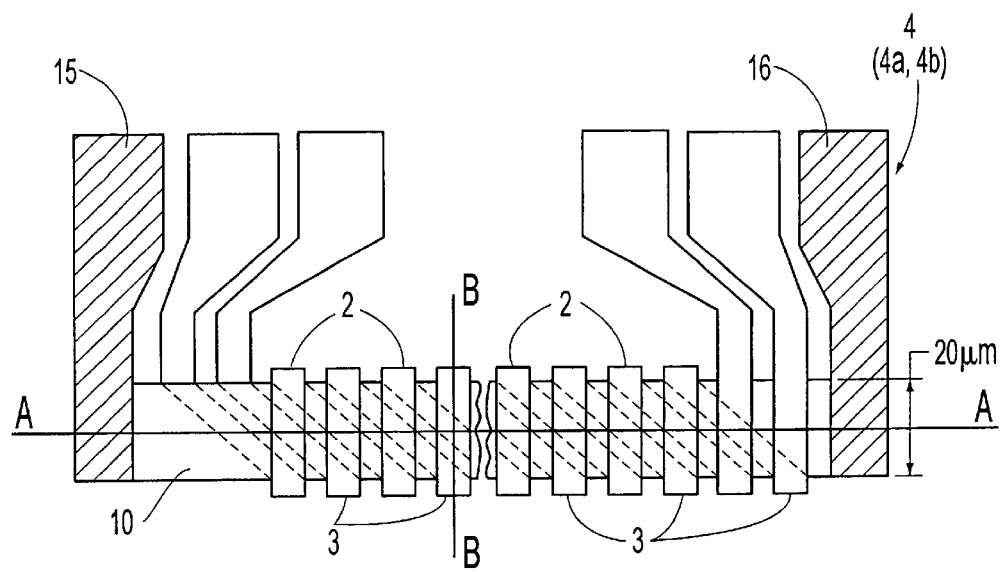
FIG. 2 is a sectional plan view showing a thin-film magnetic impedance element (thin-film MI element) used in the magnetic sensor shown in FIG. 1.
Figure 3:
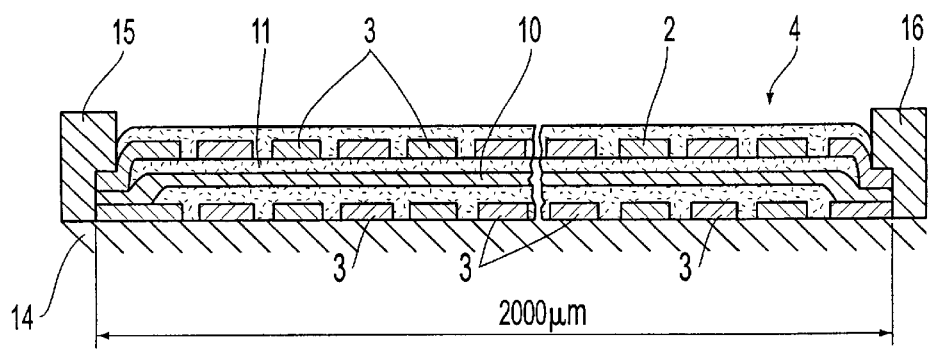
FIG. 3 is a cross-sectional view taken along a line A—A of FIG. 2.
Figure 4:
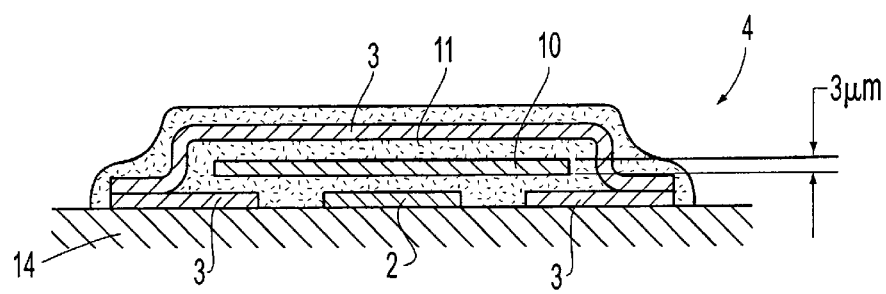
FIG. 4 In a cross-sectional view taken along a line B—B of FIG. 2.

As the magnetic impedance element 4, there is used a thin-film magnetic impedance (MI) element (hereinafter referred to as "thin-film MI element 4") shown in FIGS. 2 to 4. FIG. 2 is a diagram schematically showing the structure of the thin-film MI element 4, FIG. 3 is a cross-sectional view taken along a line A—A of FIG. 2 and FIG. 4 is a cross-sectional view taken along a line B—B of FIG. 2.

The thin-film MI element 4 is structured in such a manner that a thin-film magnetic core having configuration 20 $\mu$m in width, 3 $\mu$m in thickness and 2000 $\mu$m in length (hereinafter referred to as "thin-film magnetic core 10" which constitutes a ferromagnetic thin-film magnetic core as claimed in claim 1) is used as a ferromagnetic substance 10, a thin-film coil for negative feedback (hereinafter referred to as "negative feedback thin-film coil 2") as a negative feedback coil 2 and a thin-film coil for bias (hereinafter referred to as "bias thin-film coil 3) as a bias coil 3 are wound around the thin-film magnetic core 10 through an insulating film 11 three-dimensionally. The negative feedback thin-film coil 2 and the bias thin-film coil 3 are alternately wound around the thin-film magnetic core 10, and the number of turns is 42, respectively. Also, a part of the respective electrode portions is provided with an Au pad for wire bonding. Referring to FIGS. 3 and 4, reference numeral 14 denotes a substrate made of a non-magnetic substance (which constitutes a substrate as claimed in claim 2), reference numeral 15 denotes a first electrode and reference numeral 16 denotes a second electrode.

Then, the characteristic of the manufactured thin-film MI element 4 will be described. In this example, the dimensions of the thin-film magnetic core 10 are 20 $\mu$m in width, 3 $\mu$m in thickness and 2000 $\mu$m in length as described above, and the negative feedback coil 2 and the bias thin-film coil 3 are alternately wound on the sate face, and the number of turns is 42, respectively. With the structure in which the negative feedback coil 2 and the bias coil 3 are alternately wound around the thin-film magnetic core 10 on the same face, a bias magnetic field and a negative feedback magnetic field can be uniformly applied to the respective portions of the thin-film magnetic core 10, to thereby improve the linearity of the sensitive characteristic as a thin-film MI element 4 (magnetic sensor 1).

Figure 5:
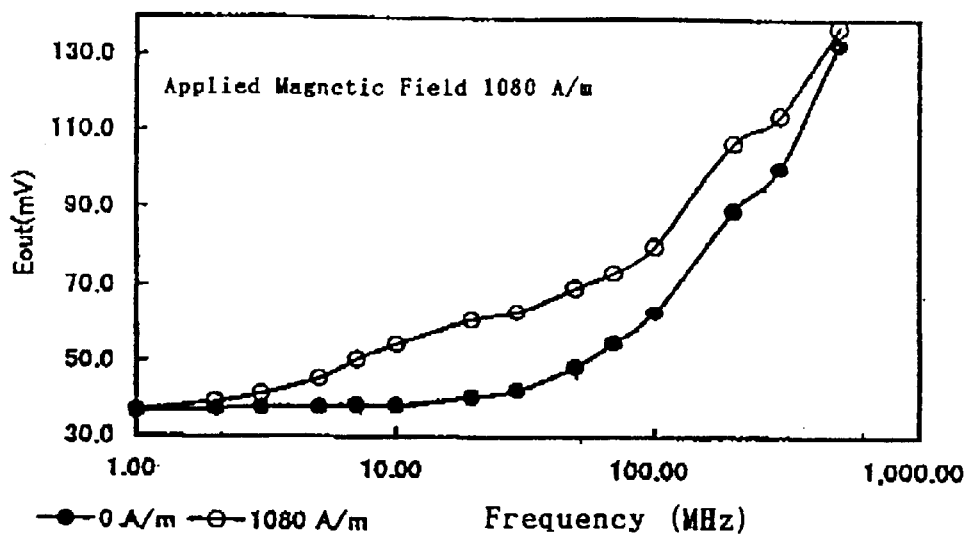
FIG. 5 is a graph showing the frequency of supply current to output voltage characteristic of the MI element shown in FIG. 1.
Figure 6:
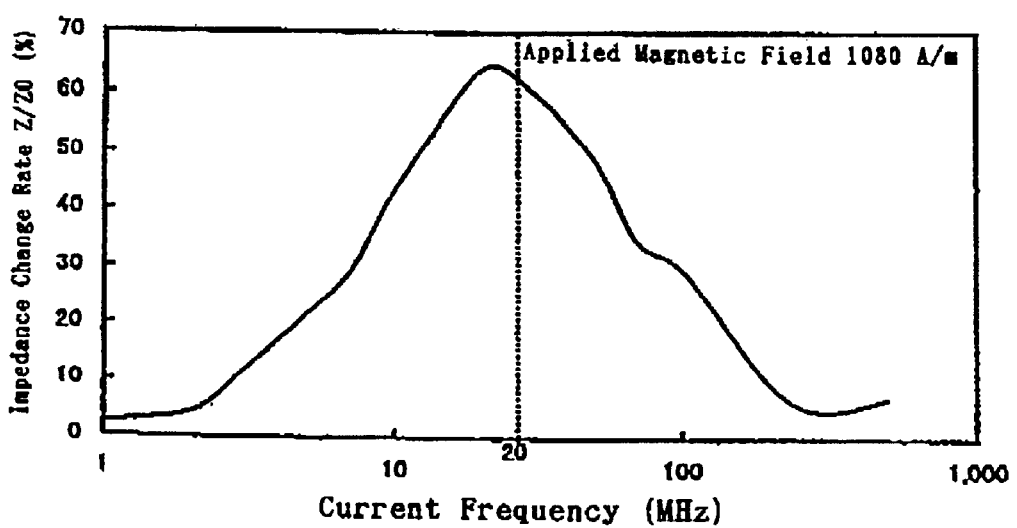
FIG. 6 is a graph showing the frequency of supply current to impedance change rate characteristic of the MI element shown in FIG. 1.

FIG. 5 shows a frequency characteristic of a voltage E between both end electrodes (first and second electrodes 15 and 16) of the thin-film MI element 4 when the magnetic fields (Hez) of 0 and 1080 A/m are applied to the thin-film MI element 4 in a longitudinal direction of the thin-film MI element 4 in the case where the thin-film magnetic core 10 is made of NiFe plating. In this case, a difference ΔE in E between Hex=0 A/m and Hex=1080 A/z was the largest when the frequency of the supply current was about 20 MHz as shown in FIG. 6.

Figure 7:
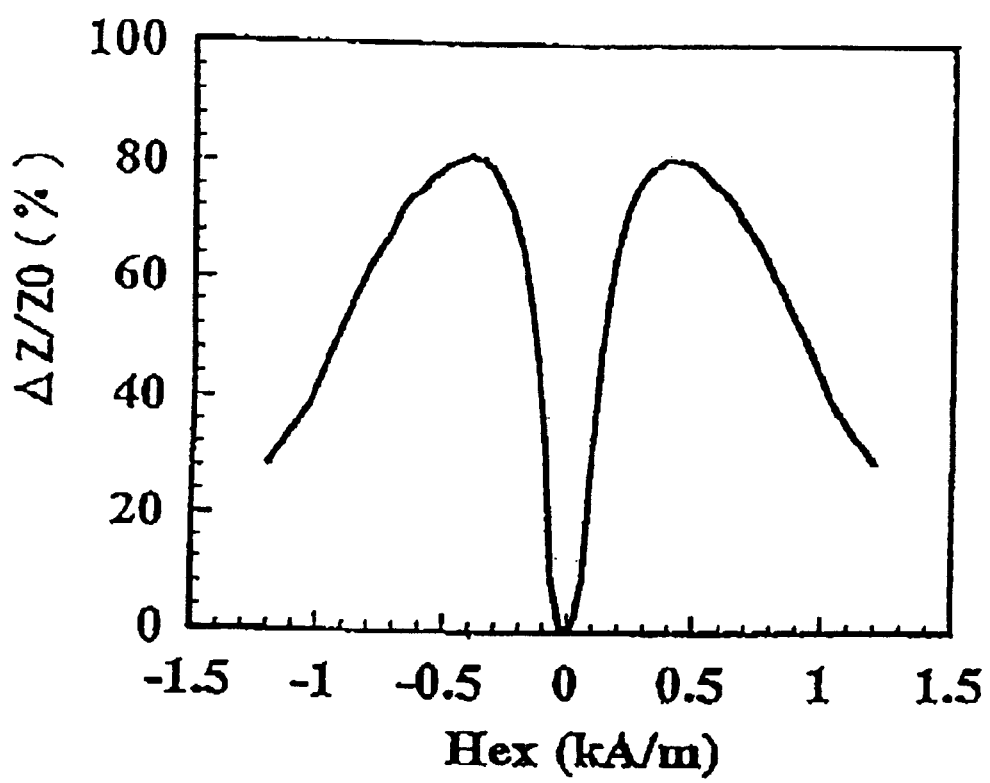
FIG. 7 is a graph showing the external magnetic field to impedance change rate characteristic of the MI element shown in FIG. 1.

FIG. 7 shows the dependency of the applied magnetic field (Box) of the change rate of the impedance when the frequency of the supply current is 20 MHz. As the applied magnetic field increases, the change rate ΔZ/Z0 of the impedance increases more, and the change rate A Z/Z0 becomes maximum at the anisotropy magnetic field Hk of the element, and further when Hex>Hk, ΔZ/Z0 becomes small. Also, the change amount (magnetic field sensitivity) of the impedance per unit applied magnetic field becomes maxim at about Hex=200 A/m and exhibits the magnetic field sensitivity of 0.4%/(A/m).

The oscillating circuits as claimed in claims 5 to 8 are shown in FIGS. 8 to 11.

What are shown in FIGS. 8 to 11 are oscillating circuit 5 for supplying a high-frequency current to the magnetic impedance element 4, respectively.

Figure 8:
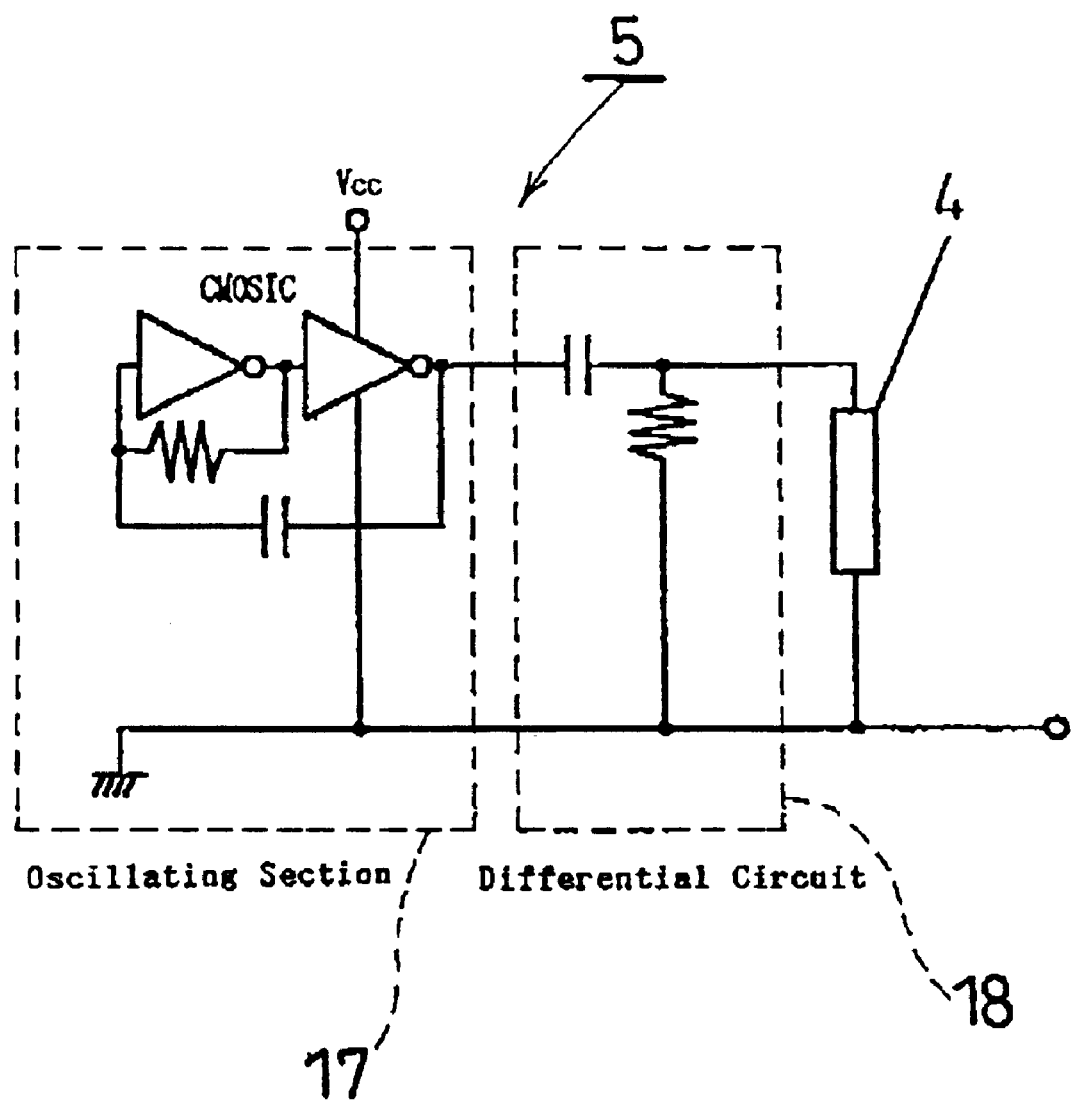
FIG. 8 is a circuit diagram showing a first example of the oscillating circuit shown in FIG. 1.

The oscillating circuit 5 shown in FIG. 8 is a C-MOS oscillating circuit using RC which is a circuit in which a differentiating circuit 18 is added to an oscillating section 17.

Figure 9:
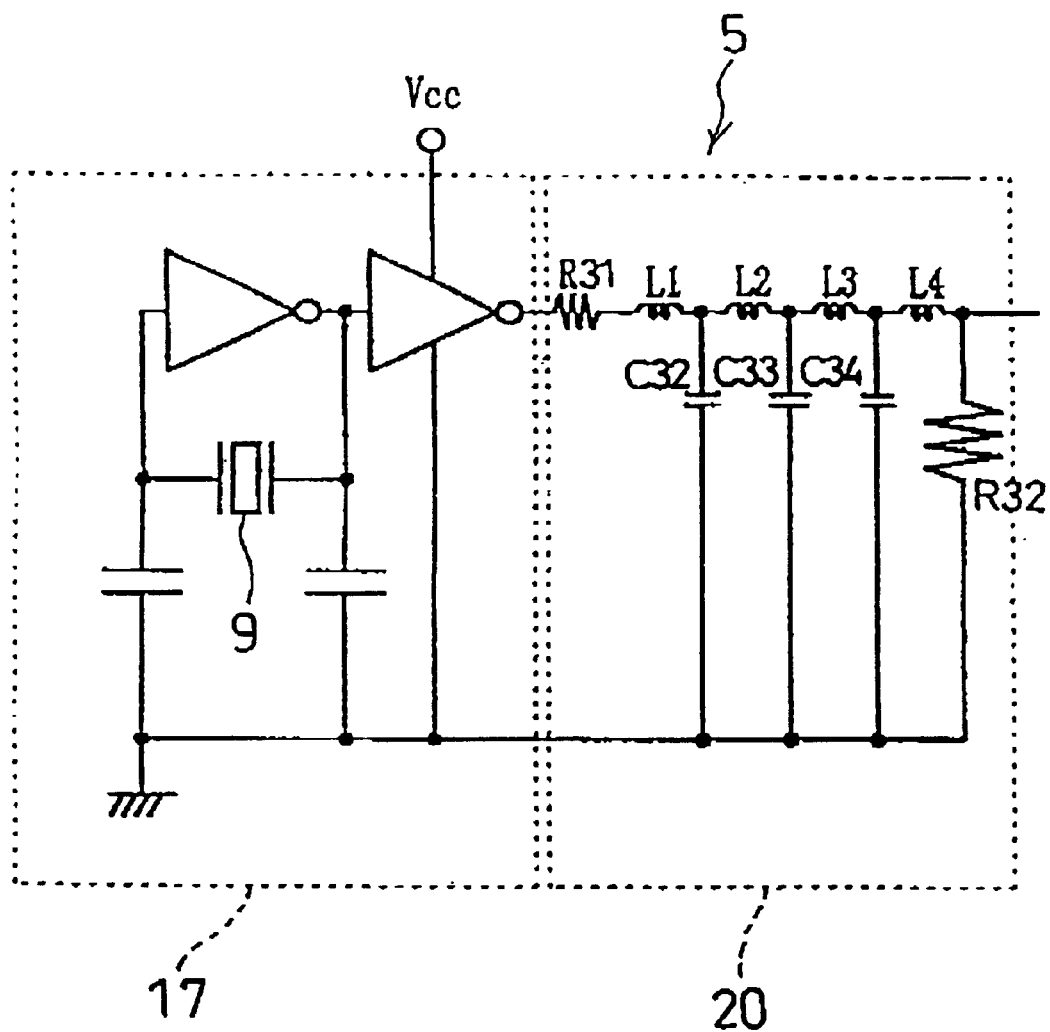
FIG. 9 is a circuit diagram showing a second example of the oscillating circuit shown in FIGS. 1 and 18.

The oscillating circuit 5 shown in FIG. 9 is a C-MOS oscillating circuit S using a crystal oscillator 9. The oscillating circuit 5 shown in FIG. 9 is high in the stabilization of frequency and stabilized in amplitude (amplitude=Vcc). Since a signal is allowed to pass through a filter section 20 consisting of a low-pass filter or a band-pass filter after it has been outputted from the C-MOS oscillating circuit, a sine wave is obtained. The low-pass filter is formed of an inexpensive LC filter. and it is formed of a Butterwerth type low-pass filter in the figure, but may be of a Chebyshev-type low-pass filter.

Figure 10:
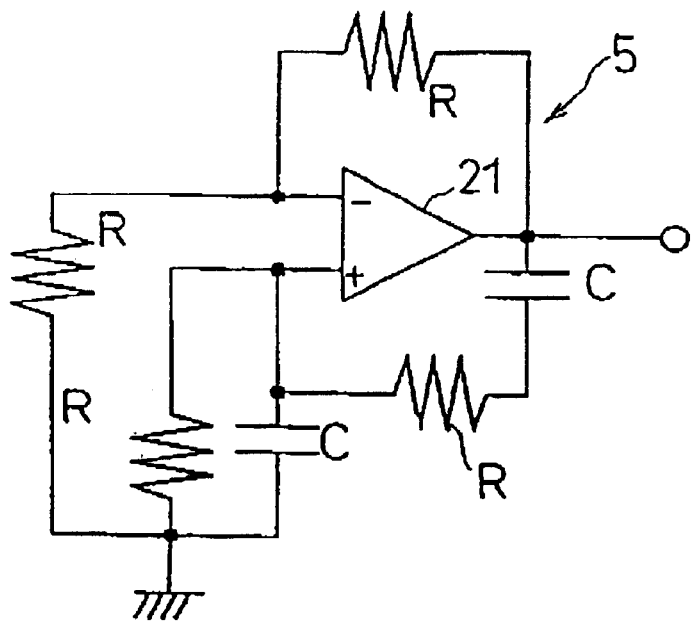
FIG. 10 is a circuit diagram showing a third example of the oscillating circuit shown in FIGS. 1 and 18.

The oscillating circuit 5 shown in FIG. 10 is a Wien-Bridge oscillating circuit 5 using an operational amplifier 21. A sine wave is obtained from this circuit.

Figure 11:
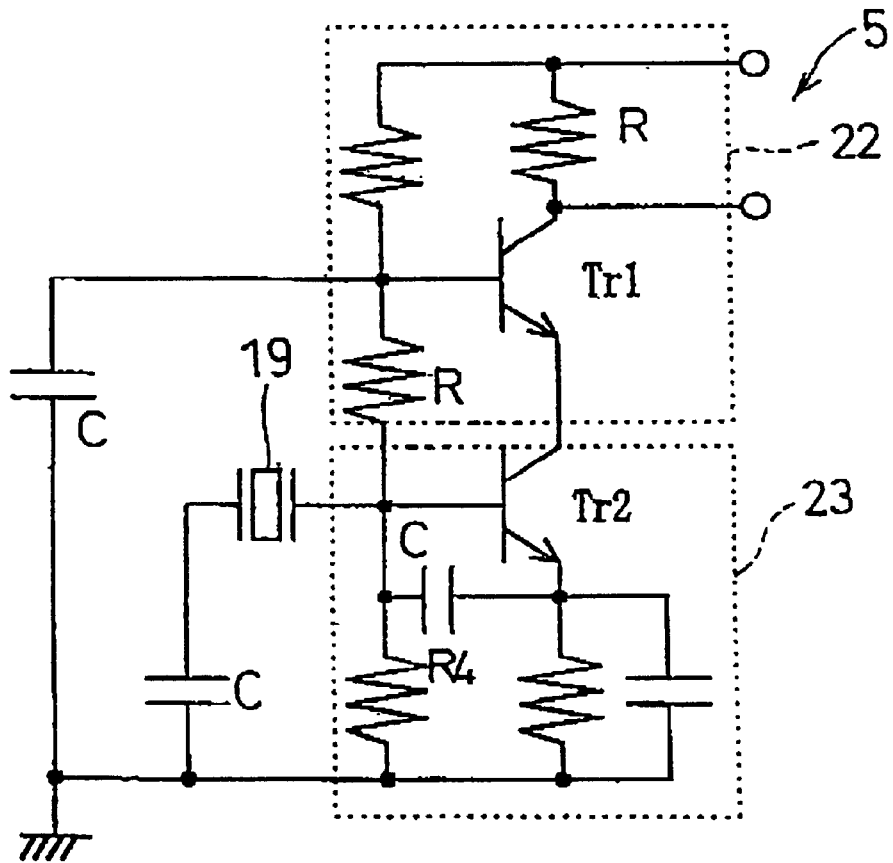
FIG. 11 is a circuit diagram showing a fourth example of the oscillating circuit shown in FIGS. 1 and 18.

The oscillating circuit 5 shown in FIG. 11 comprises a Colpitts oscillating circuit 5 which is structured in an emitter grounding manner and a circuit in which amplifiers 22 and 23 are cascade-connected and structured in a base grounding manner. The advantage of this oscillating circuit 5 resides in that an influence of a load variation on the oscillating section 17 is suppressed as much as possible so that stabilized oscillation can be supplied because an influence of the mirror effect can be removed. Also, the oscillating circuit S also has the advantage that the frequency characteristic can be improved.

Figure 12:
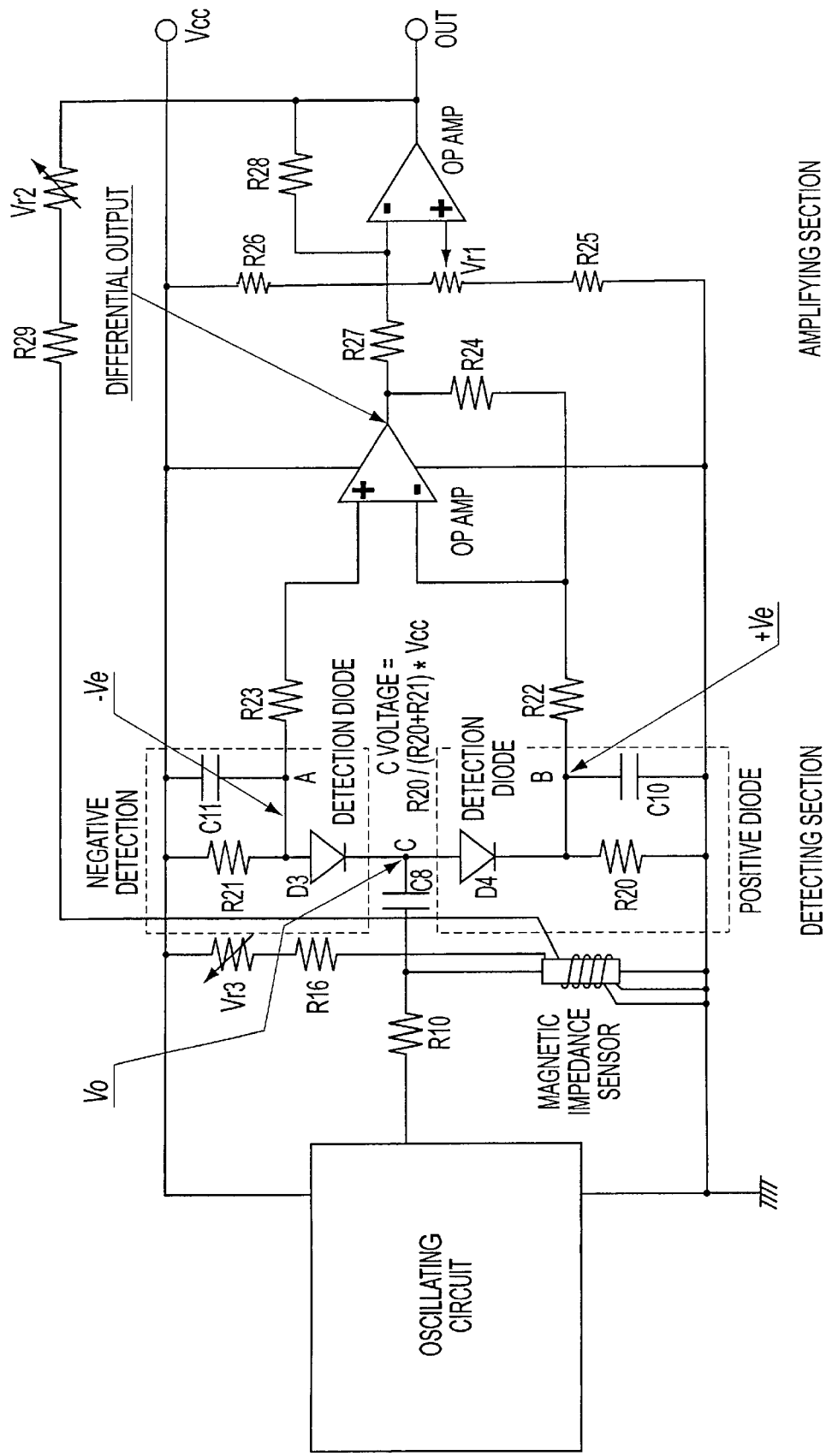
FIG. 12 is a diagram showing a detecting circuit in which a constant current flows in a diode.
Figure 13:
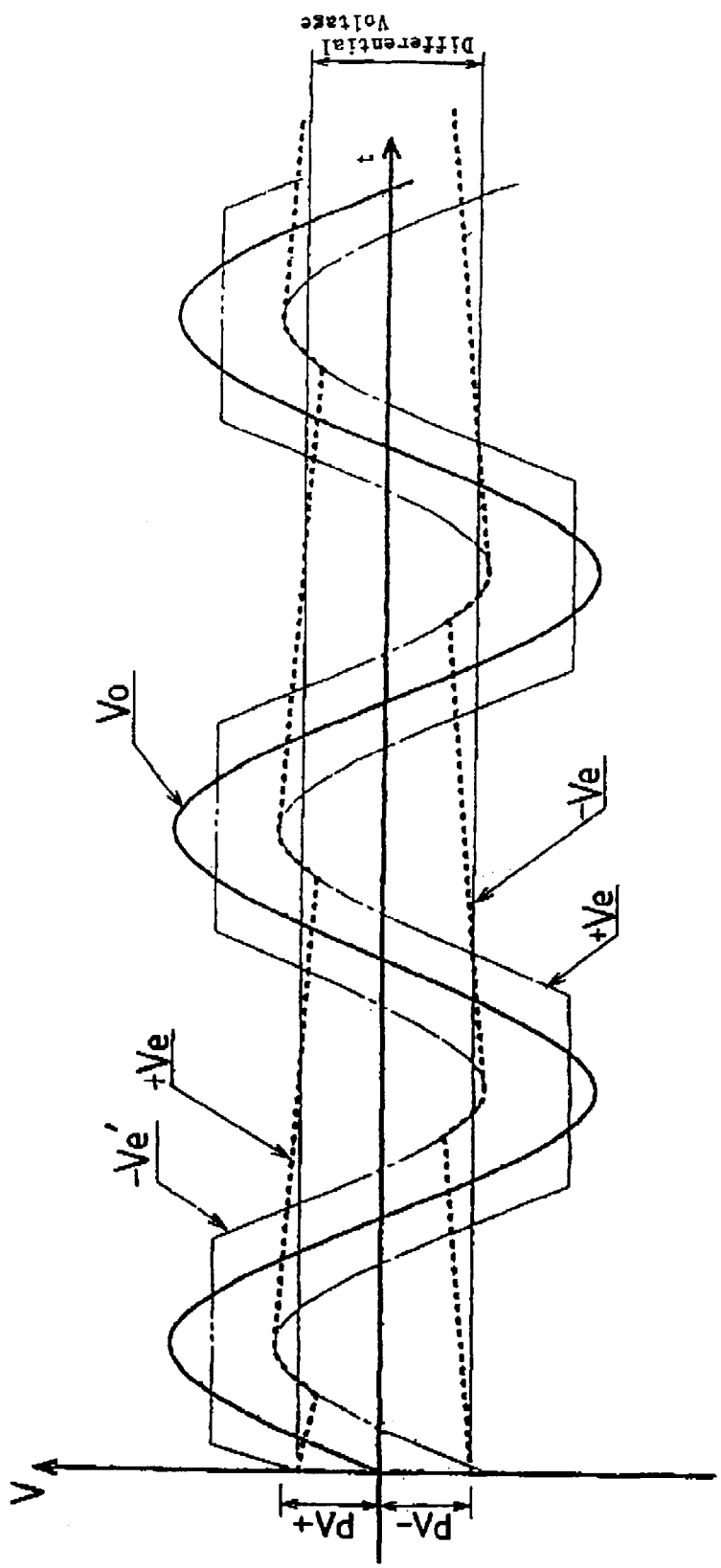
FIG. 13 is a signal waveform diagram of the detecting circuit shown in FIG. 12.

FIG. 12 is a circuit that converts the high-frequency energizing output of a magnetic impedance sensor to a DC voltage. A signal outputted from the magnetic impedance elect is rectified through a detection diode and soothed. However, because a constant current flows in the detection diode, the waveform of the voltage when no smoothing capacitor C11 is provided is −Ve' as shown in FIG. 13 and shifted by a diode voltage Vd. With addition of C11 to the circuit, the voltage has a waveform of −Ve, and the negative side of the voltage is detected. Similarly, at a positive detection side, in the case where no C10 is provided, the voltage has a waveform of +Ve' which is shifted by −Vd. The voltage has a waveform of +Ve because it is smoothed by C10, and a positive side is detected.

The waveforms positively and negatively detected are differentially detected and amplified by an operational amplifier.

Figure 14:
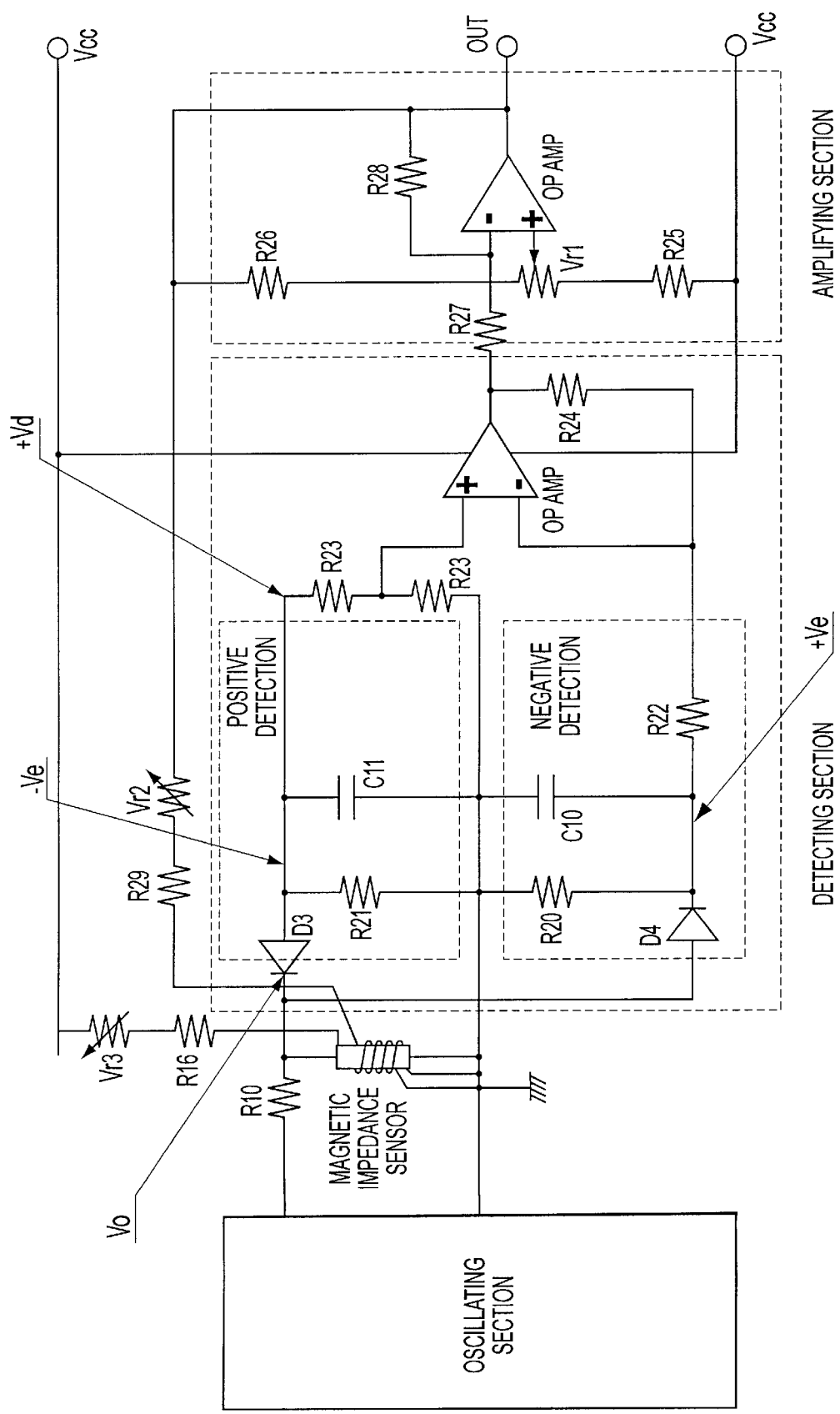
FIG. 14 is a diagrams showing the detecting circuit when a detection diode is grounded to GND.
Figure 15:
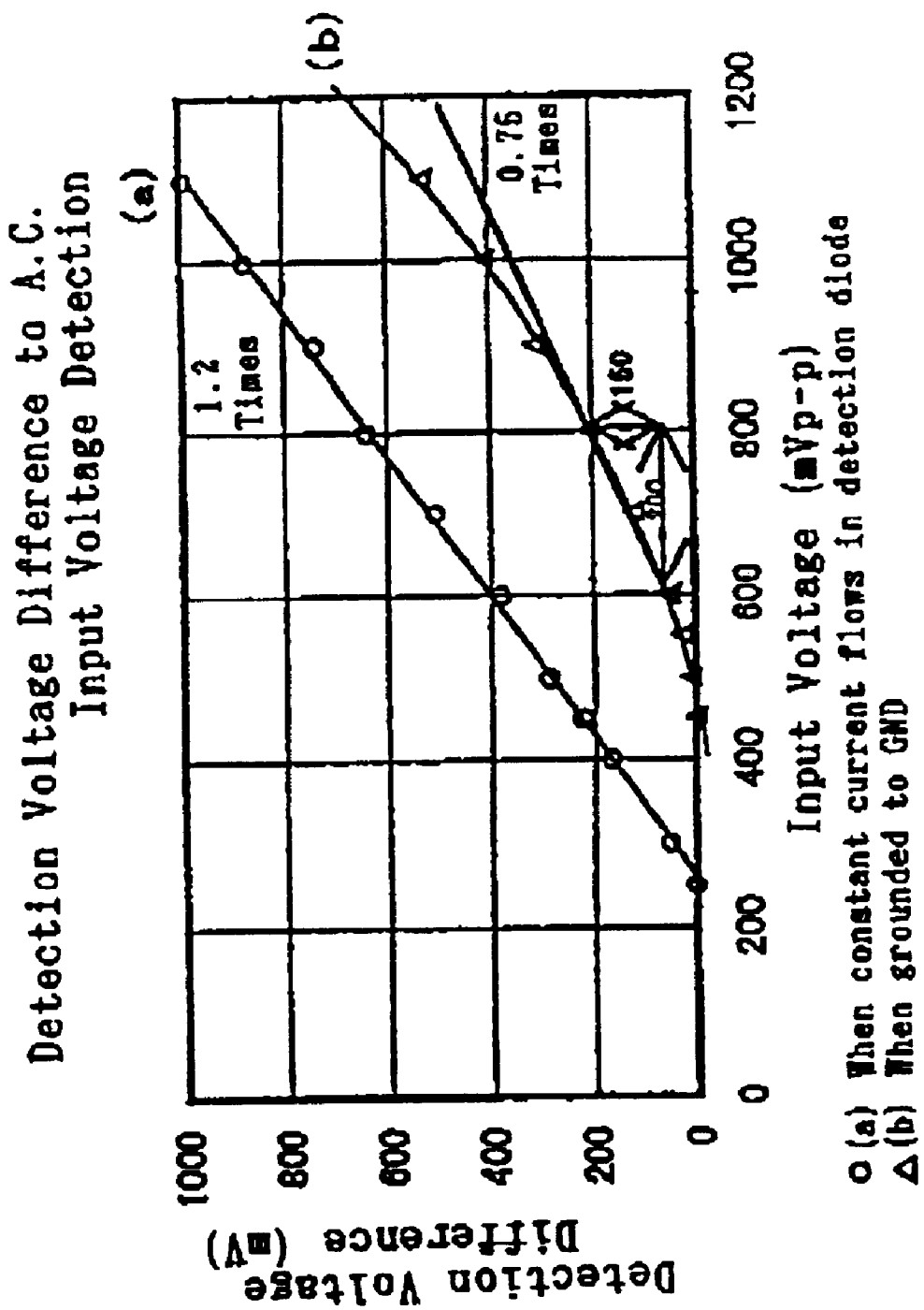
FIG. 15 is a graph showing the detection capability of a detecting section to an a.c. input voltage.

By the way, the detected voltage is remarkably improved by allowing the constant current to flow in the detection diode. As usual, as shown in FIG. 14, the detection diode is grounded to GND through a resistor. In this circuit, an output from the operational amplifier exhibits a quadratic curve as show in a graph of FIG. 15b. This curve is influenced by the forward voltage characteristic of the diode, and in order to remove this influence, a constant current is made to flow in the detection diode (FIG. 12). This characteristic is shown in FIG. 15a in which even when an input voltage is small, the voltage can be detected at a given rate and exhibits a change of 1.2 times as large as that of the input voltage. In the case where the detected diode is grounded to GND as shown in FIG. 14, when the input voltage is changed by 200 mVp-p from 600 mVp-p to 800 mVp-p, only the change amount of 150 mV is obtained, and only 0.75 times as large as the input voltage can be detected. That is, the detection sensitivity becomes high by allowing the constant current to flow in the detection diode. Also, if the diode is disconnected from GND as shown in FIG. 12, the voltage can be detected only at the positive side so that the operational amplifier can be operated by a single power supply. In this example, the detection diode is formed of a Schottky diode, but in the case where the output of a voltage between both ends of the magnetic impedance element is sufficient, a normal silicon diode may be used as the detection diode.

Figure 16:
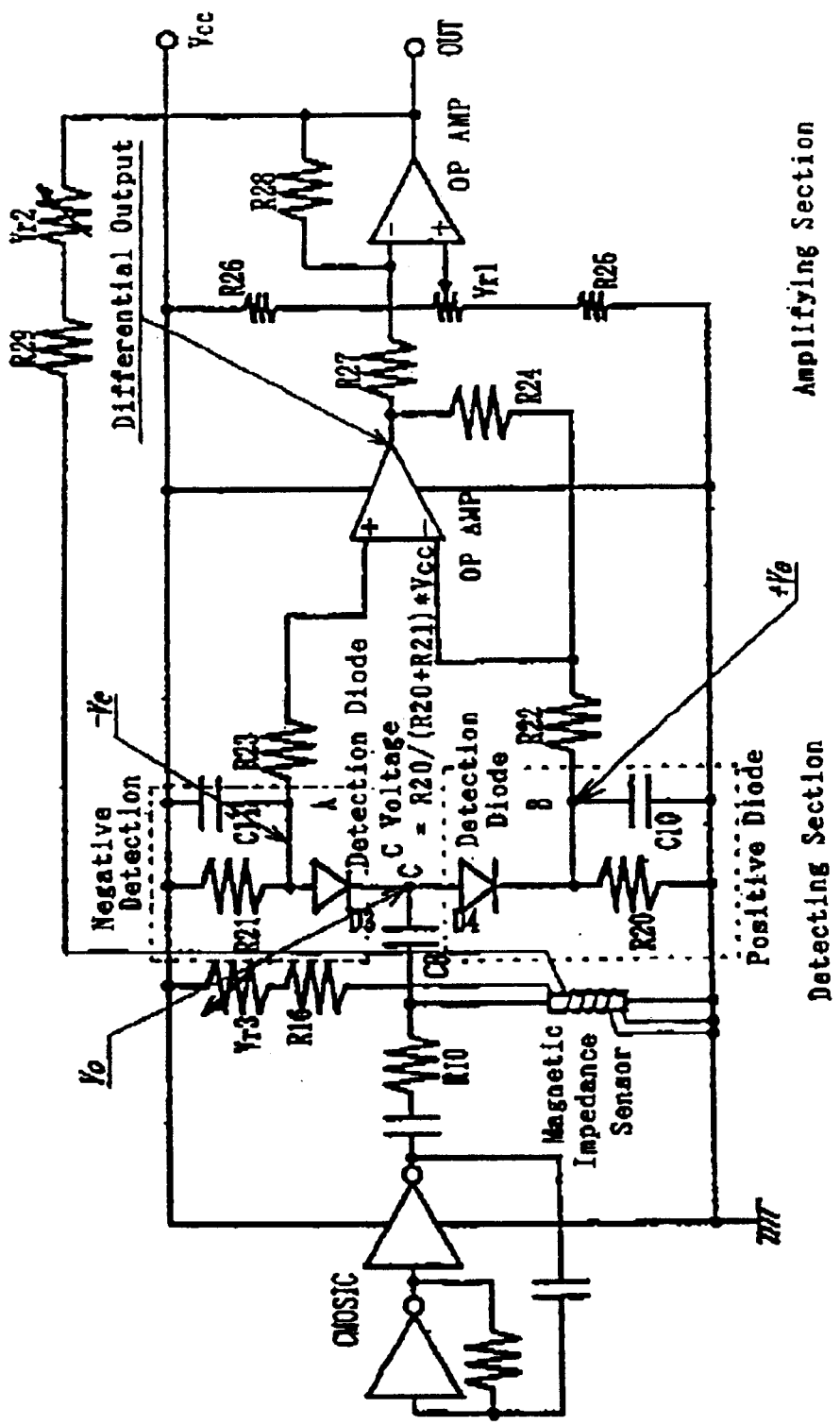
FIG. 16 is a diagram showing a circuit according to the first embodiment of the present invention.
Figure 17:
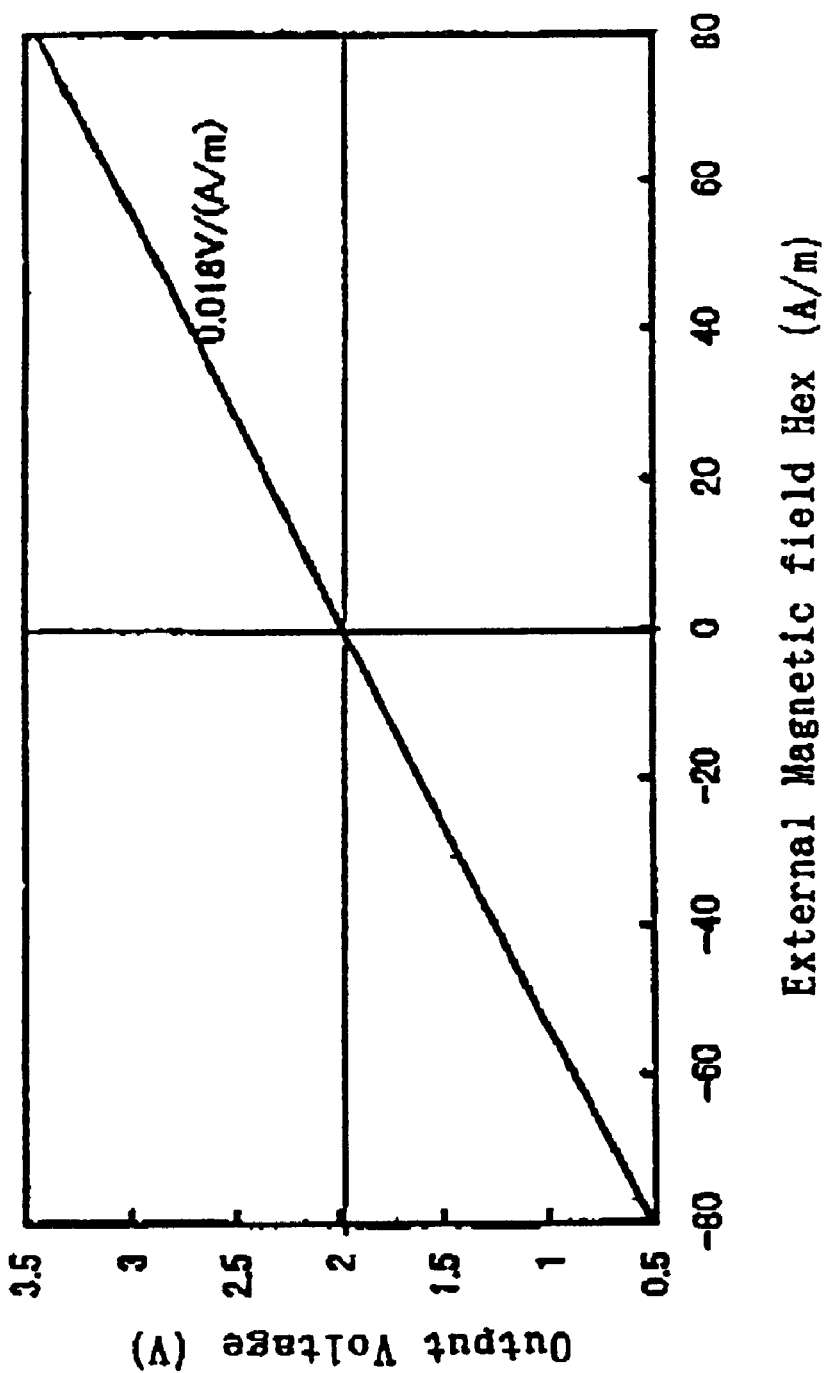
FIG. 17 is a graph showing the external magnetic field to output voltage characteristic of the magnetic sensor shown in FIG. 16.

When a negative feedback 320 A/m in bias coil magnetic field and 40% in negative feedback rate is effected by use of the circuit (FIG. 16) in accordance with the first embodiment claimed in claim 1, the sensitivity of 0.018 V/(A/m) is obtained within a measured range of ±80 A/m which exhibits an excellent linearity. As shown in FIG. 17, those results are obtained by a result that the circuit exhibits the excellent characteristic as a linear magnetic sensor.

A second embodiment in accordance with claim 2 of the present invention will be described.

Figure 18:
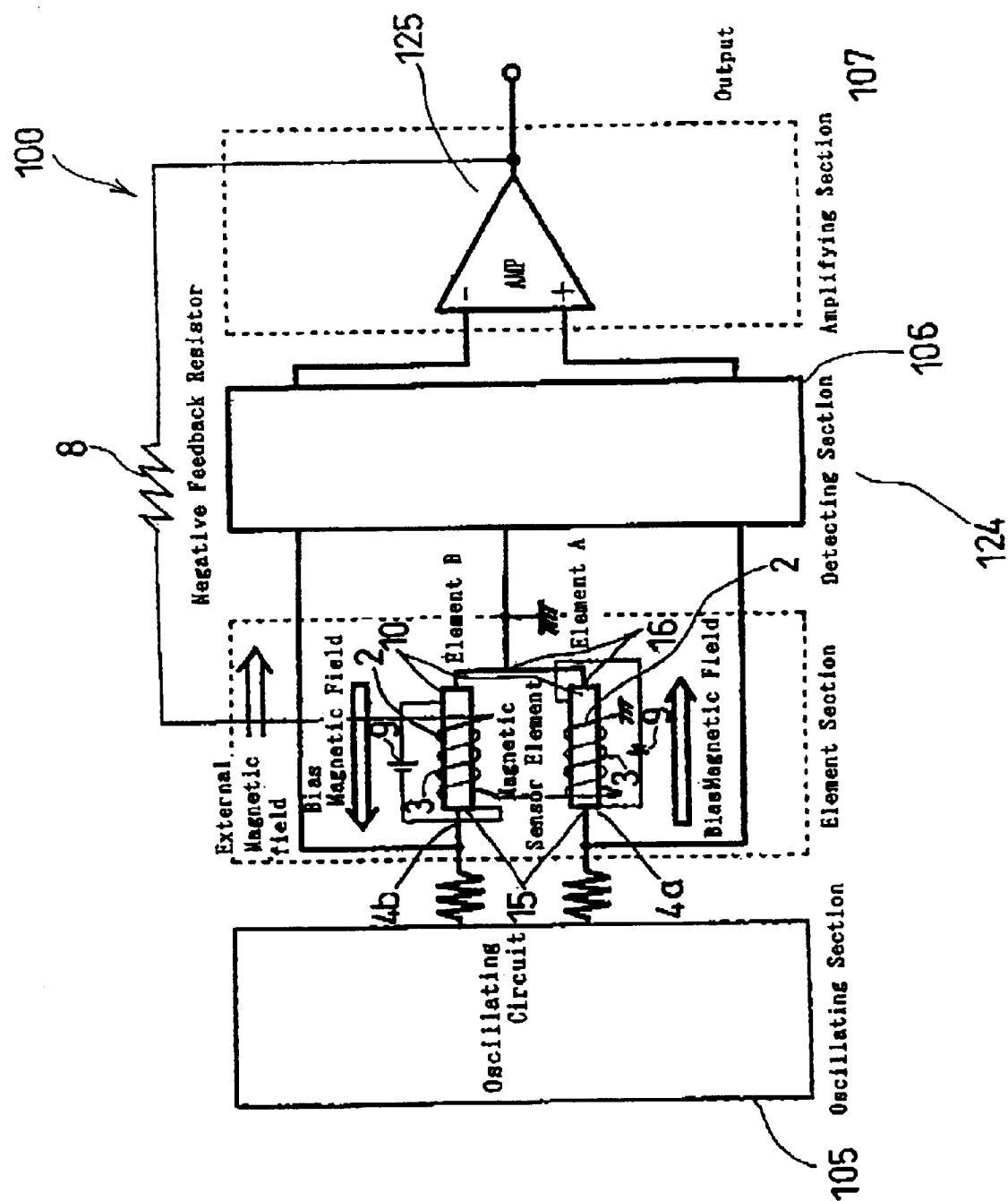
FIG. 18 is a circuit diagram schematically showing a second embodiment of the present invention.

FIG. 18 is a block diagram showing the circuit structure in accordance with claim 2. A magnetic sensor 100 of this embodiment is made up of two magnetic impedance elements 4 having a negative coil 2 and a bias coil 3 which are identical with the magnetic impedance element as claimed in claim 1, an oscillating circuit 105, a detecting circuit 106, an amplifying circuit 107 and a negative feedback resistor 8. Referring to FIG. 18, reference numeral 9 denotes a circuit (d.c. power supply circuit) which permits a d.c. current to flow into the bias coils 3 of those two magnetic impedance elements 4 such that opposite magnetic fields are applied to those bias coils 3, and reference numeral 10 denotes a ferromagnetic substance.

The oscillating circuit 105 is employed for those two magnetic impedance elements as show in FIG. 19. Likewise, the circuits shown in FIGS. 9 to 11 are used for the oscillating circuit 105.

In the magnetic sensor 100 thus structured, a high-frequency energizing current is supplied to those two magnetic impedance elements 4 by the oscillating circuit 105. Also, as so in FIG. 18, when an external magnetic field is applied to the magnetic impedance element 4. the impedance of the magnetic impedance element 4 varies.

Figure 20:
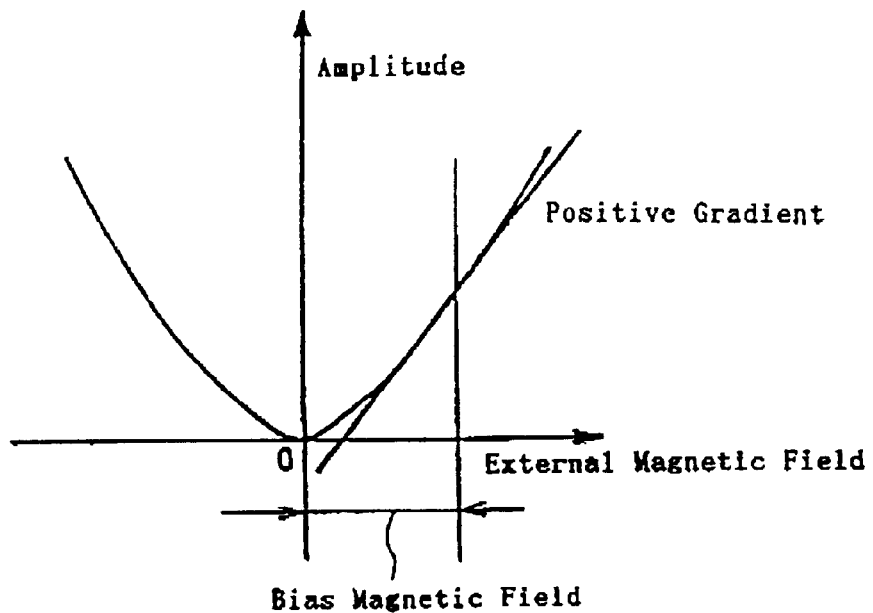
FIG. 20 is a graph showing the external magnetic field to amplitude characteristic of the first MI element shown in FIG. 18.
Figure 21:
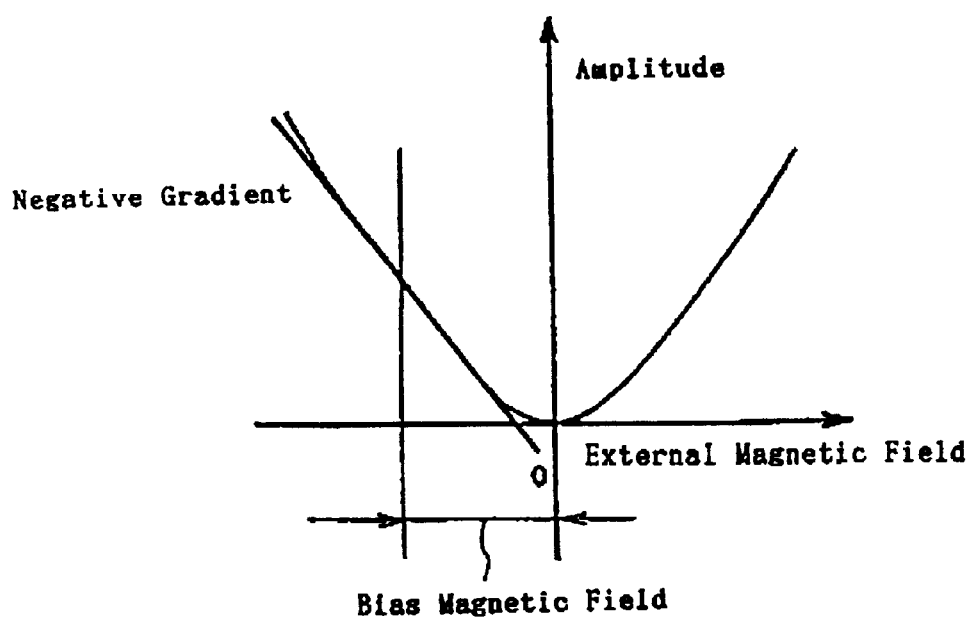
FIG. 21 is a graph showing the external magnetic field to amplitude characteristic of the second MI element shown in FIG. 18.

Opposite bias magnetic fields are applied to those two magnetic impedance elements 4 (hereinafter the magnetic impedance element 4 on the lower side of FIG. 18 being referred to as "first MI element 4a" and the magnetic impedance element 4 on the upper side of FIG. 18 being referred to as "second MI element 4b" for convenience), respectively. In this case, a positive bias magnetic field is applied to the first MI element 4a while a negative bias magnetic field is applied to the second MI element 4b. A voltage (voltage amplitude) between the first electrode 15 and the second electrode 16 of the thin-film magnetic core 10 of the first MI element 4a due to the bias magnetic field exhibits a positive inclination as shown in FIG. 20, whereas a voltage (voltage amplitude) between the electrode 15 and the second electrode 16 of the thin-film magnetic core 10 of the second MI element 4b due to the bias magnetic field exhibits a negative inclination as shown in FIG. 21.

Then, the detecting section 106 detects the voltage (a voltage developed by the external magnetic field and the bias magnetic field) between the first electrode 15 and the second electrode 16 of the thin-film magnetic core 10 of the first MI element 4a, and the voltage (a voltage developed by the external magnetic field and the bias magnetic field) between the first electrode 15 and the second electrode 16 of the thin-film magnetic core 10 of the second MI element 4b, and the operational amplifier 125 (corresponding to the amplifying circuit 107 in FIG. 18) differentially detects the detected signal, whereby the change amounts of the amplitudes of both voltages across the first MI element 4a and the second MI element 4b in response to the change of the external magnetic field are added together, and moreover the changes of the characteristics of the first MI element 4a and the second MI element 4b due to temperature are offset (that is, excellent in the temperature characteristic).

As the detecting circuit 106 and the amplifying circuit 107 (hereinafter referred detecting circuit 106 and amplifying circuit 107 to simply as detecting circuit 126 for convenience), there is used, for example, a detecting circuit 126B shown in FIGS. 22 and 23.

Prior to the description of the detecting circuit 126B shown in FIGS. 22 and 23, what is disclosed in Japan Applied Magnetic Society, vol. 21.793–796 (1997) will be described. The detecting circuit 126A of the C-MOS multi-vibrator type magnetic sensor disclosed in Japan Applied Magnetic Society, vol. *21.793–796* (1997) uses one diode for one of magnetic elements (magnetic impedance elements) for detection. The circuit structure of the magnetic sensor 1 having the detecting circuit 126A is shown in FIG. 28.

A detecting method in the detecting section 124 (detecting circuit 126A) is a method in which the voltage waveforms (VAin, VBin) between both ends of one magnetic impedance element (hereinafter called "first MI element 4a for convenience) and the other magnetic impedance element (hereinafter called "second MI element 4b for convenience) pass through the diodes 127 and 128 to peak-hold only the positive pole side for detection. In this case, assuming that the detected voltage of the first MI element 4a is VA, the change amount of the voltage which is changed by the external magnetic field is $\Delta$VH, when a positive magnetic field is applied to the external, the detected voltage of the first MI element 4a becomes VA+$\Delta$VH as shown in FIGS. 28 and 29. Similarly, the detected voltage of the second MI element 4b becomes VB−$\Delta$VH. In this situation, because the output of the operational amplifier 125 becomes VA=VB, 2$\Delta$VH is obtained. In the detection section 124 (detecting circuit 126A) shown in FIG. 28, the voltage waveform between both ends of the magnetic impedance element 4 is detected only at the positive pole side, and the amount of magnetic change due to the external magnetic field of the MI elements (first and second MI elements 4a, 4b) is not sufficiently detected.

Figure 22:
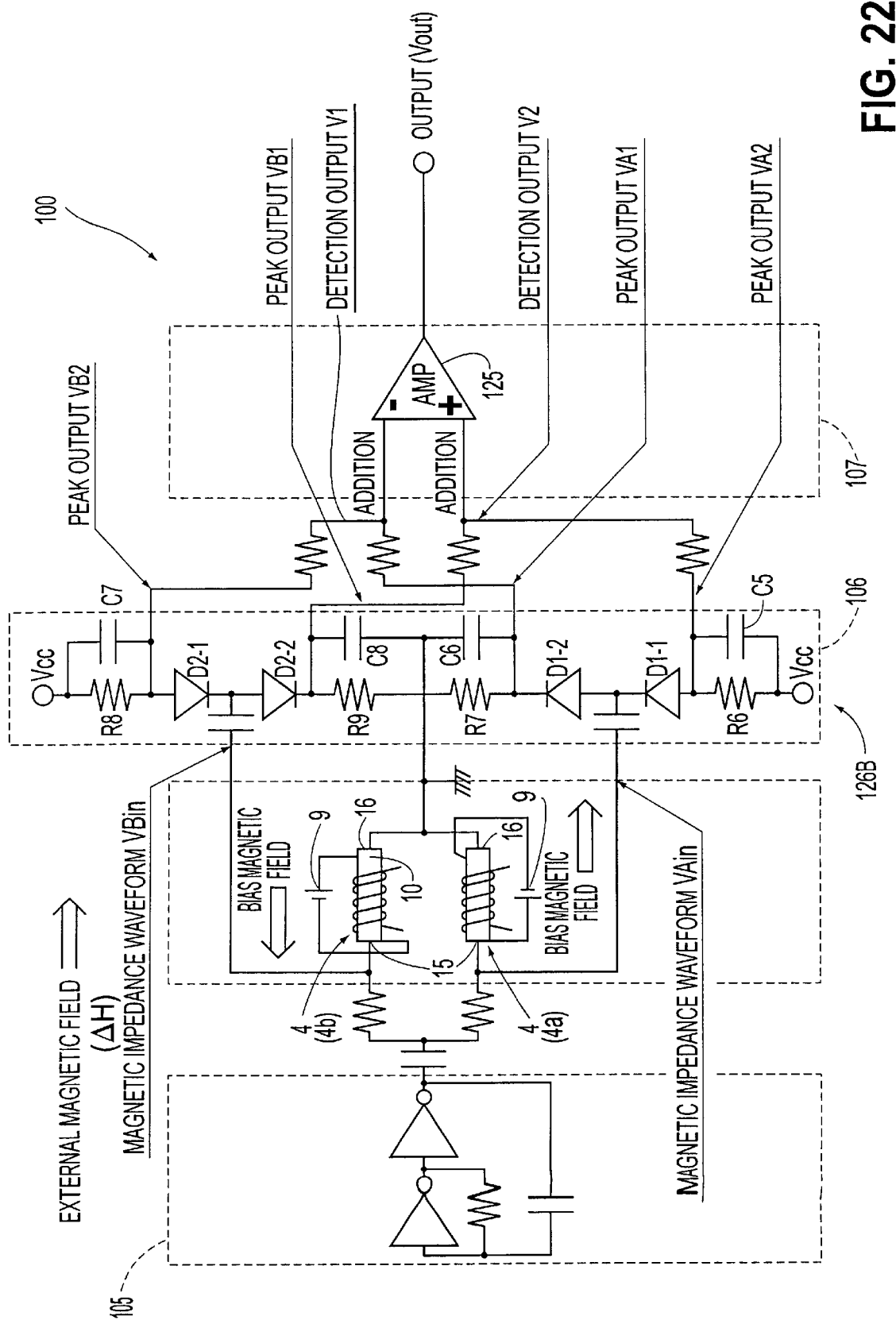
FIG. 22 is a circuit diagram showing an example of the detecting circuit and the amplifying circuit (detecting circuit) shown in FIG. 18.
Figure 23A:
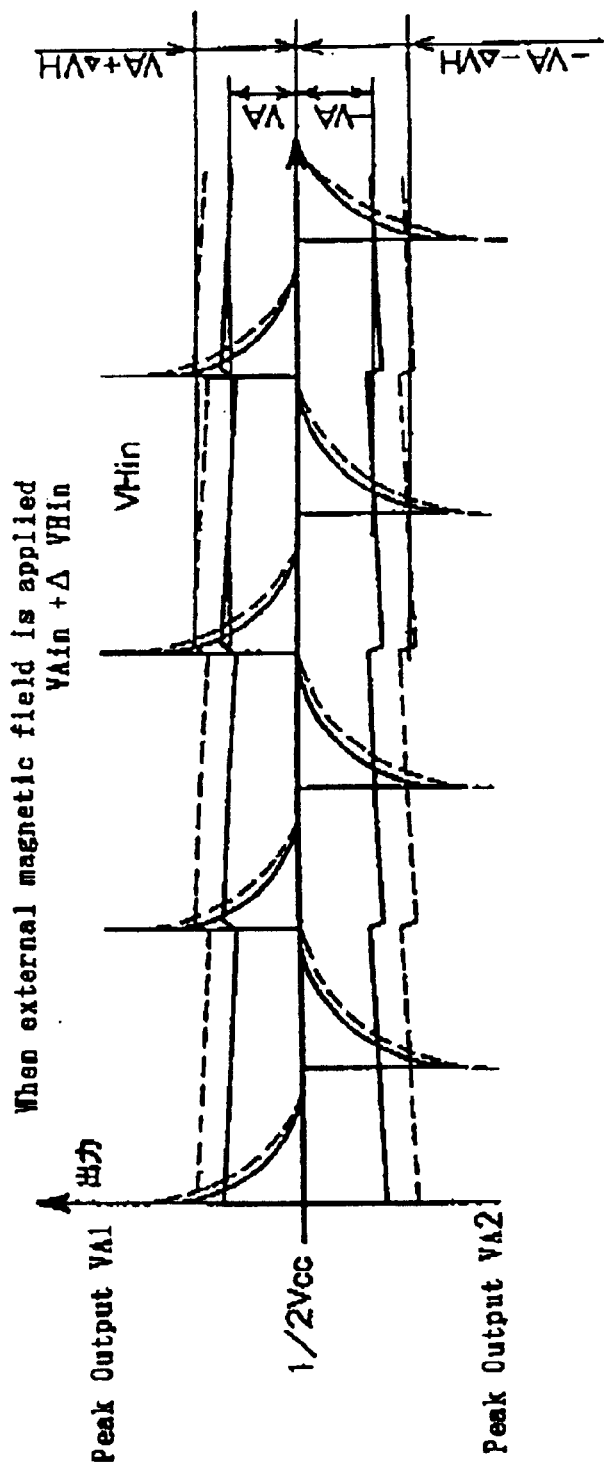
FIGS. 23A and 23B are signal waveform diagrams of the detecting circuit shown in FIG. 22, respectively.
Figure 23B:
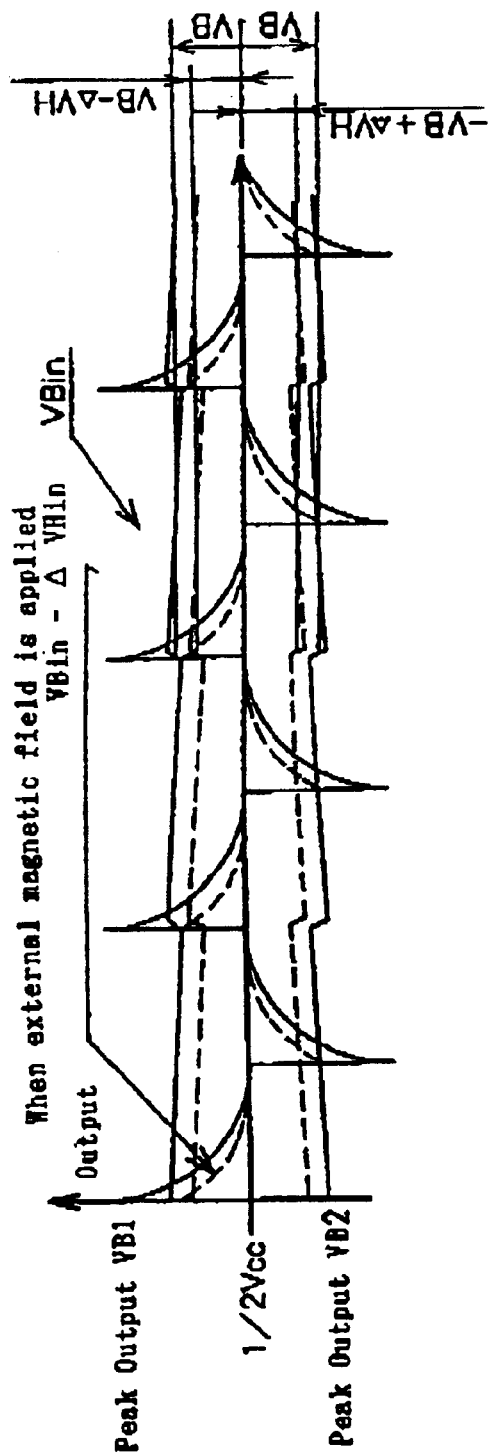
Figure 28:
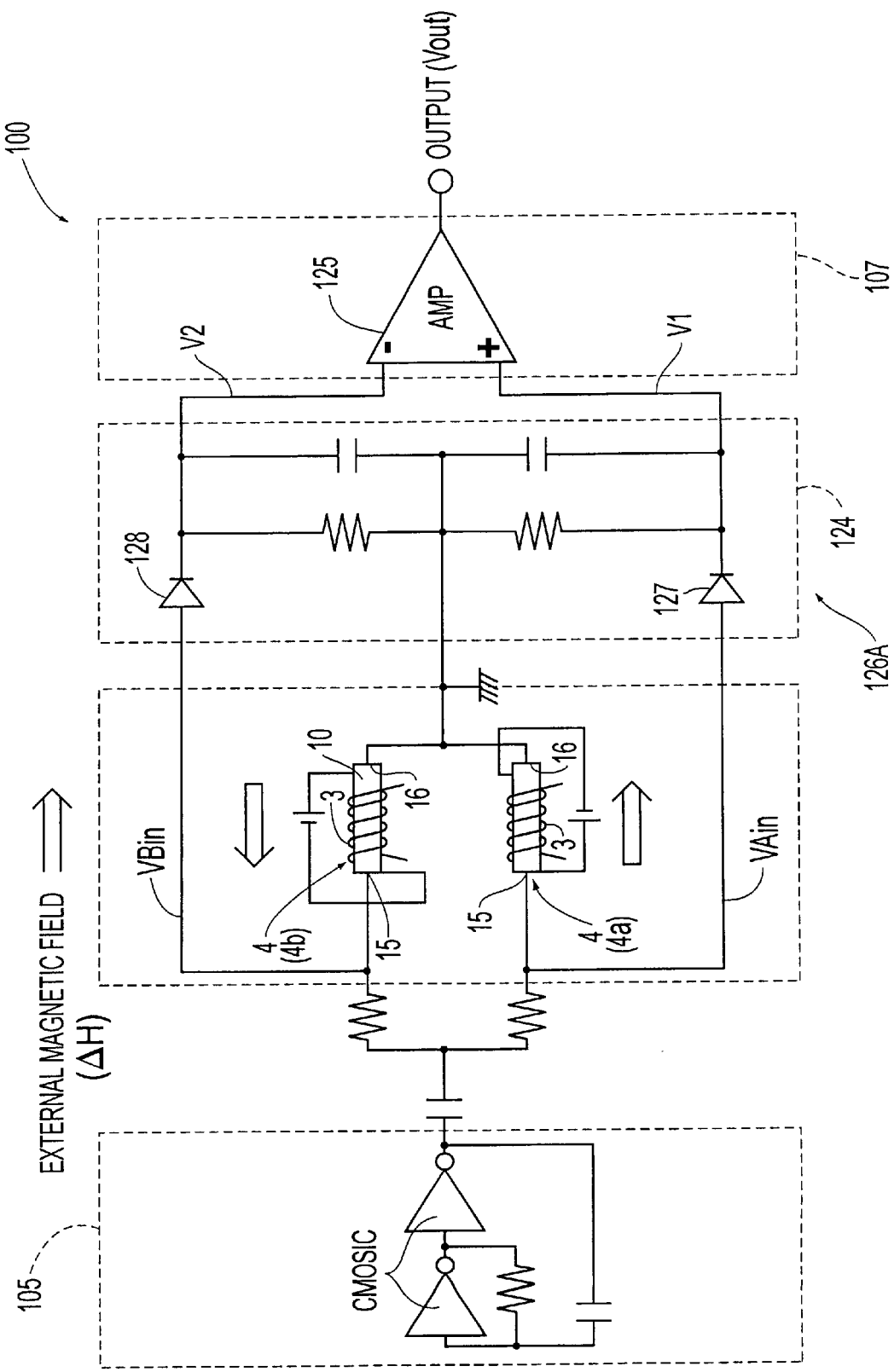
FIG. 28 is a circuit diagram showing an example of a conventional magnetic sensor.
Figure 29A:
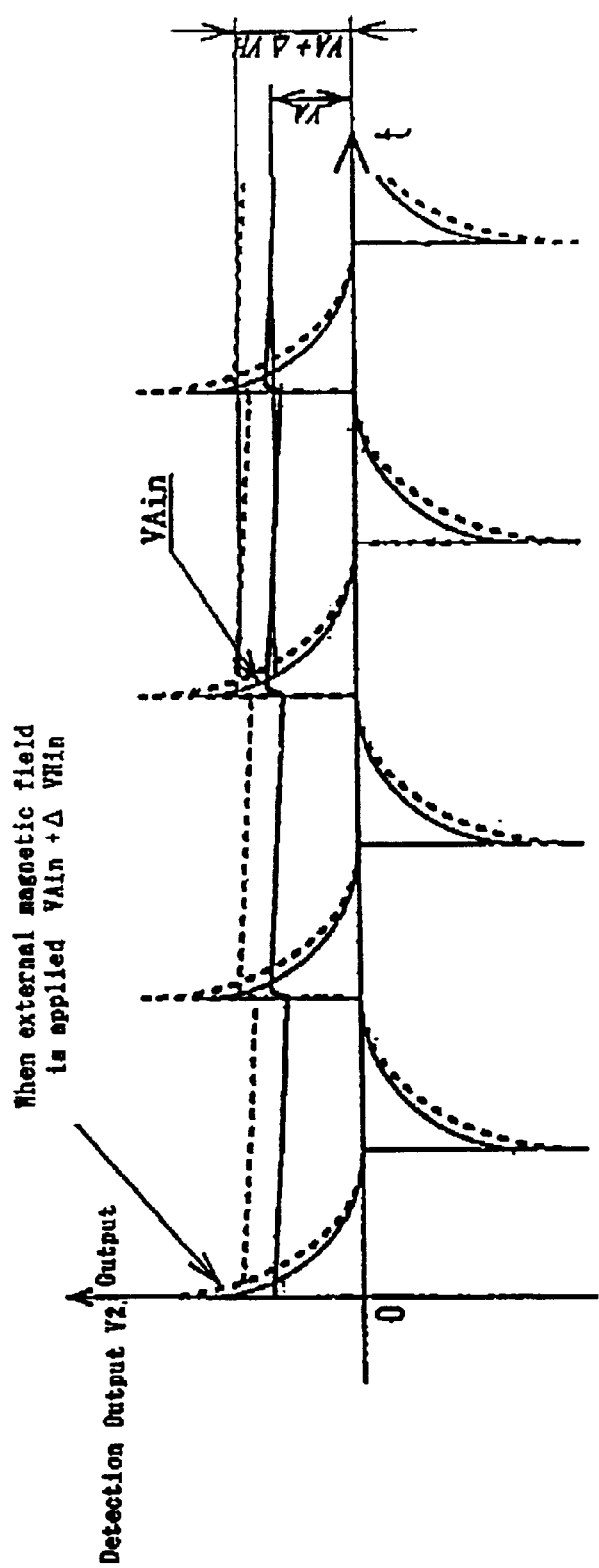
FIGS. 29A and 29B are graphs showing the signal waveforms at the respective portions of the magnetic sensor shown in FIG. 28, respectively.
Figure 29B:
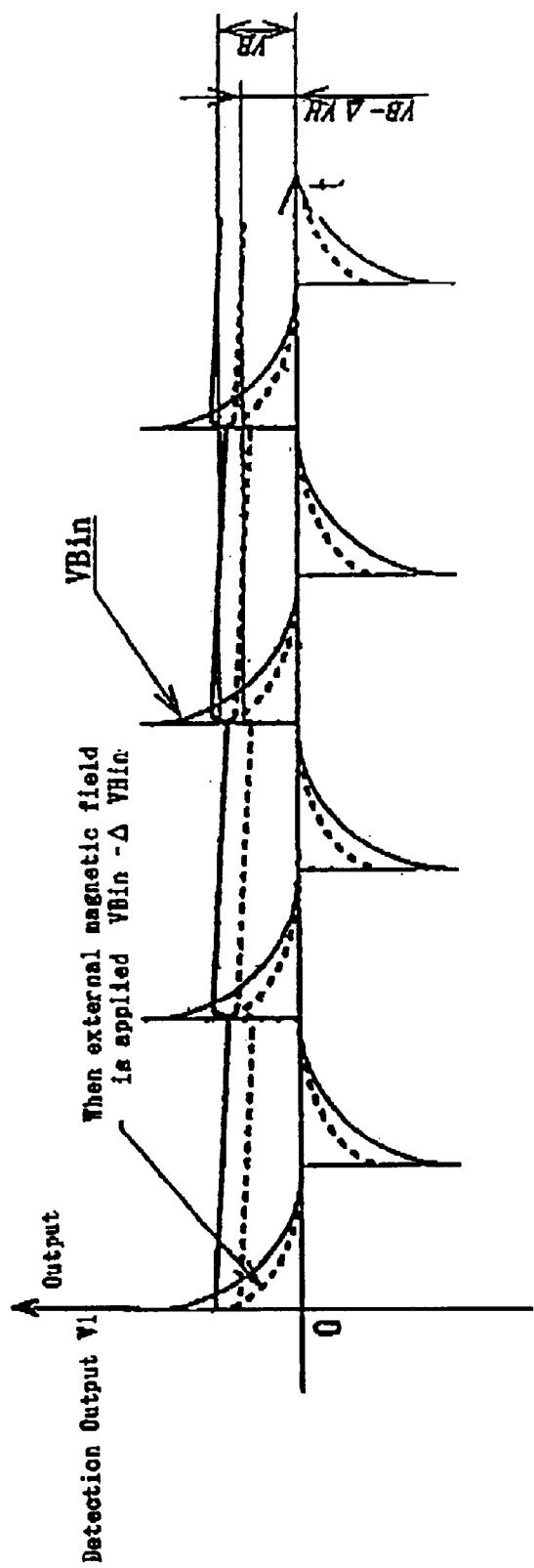
Figure 1:
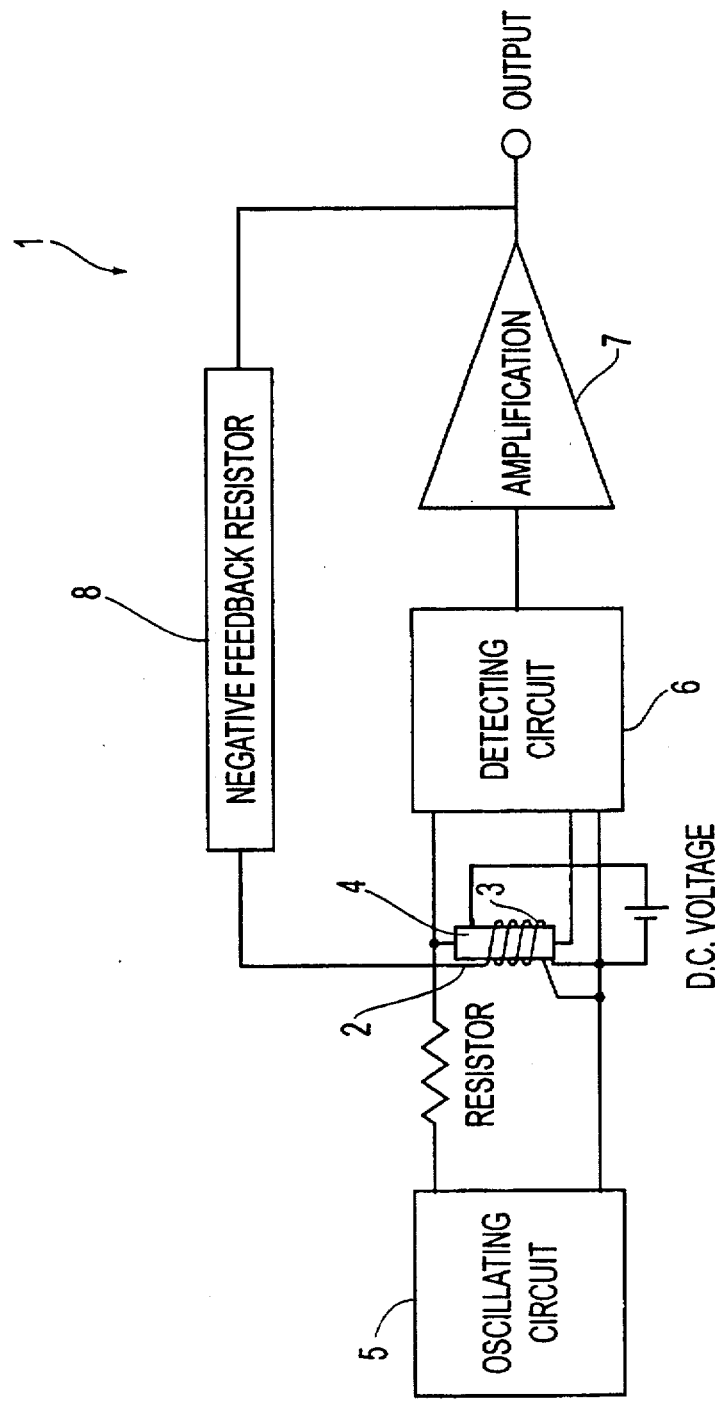
Figure 1:
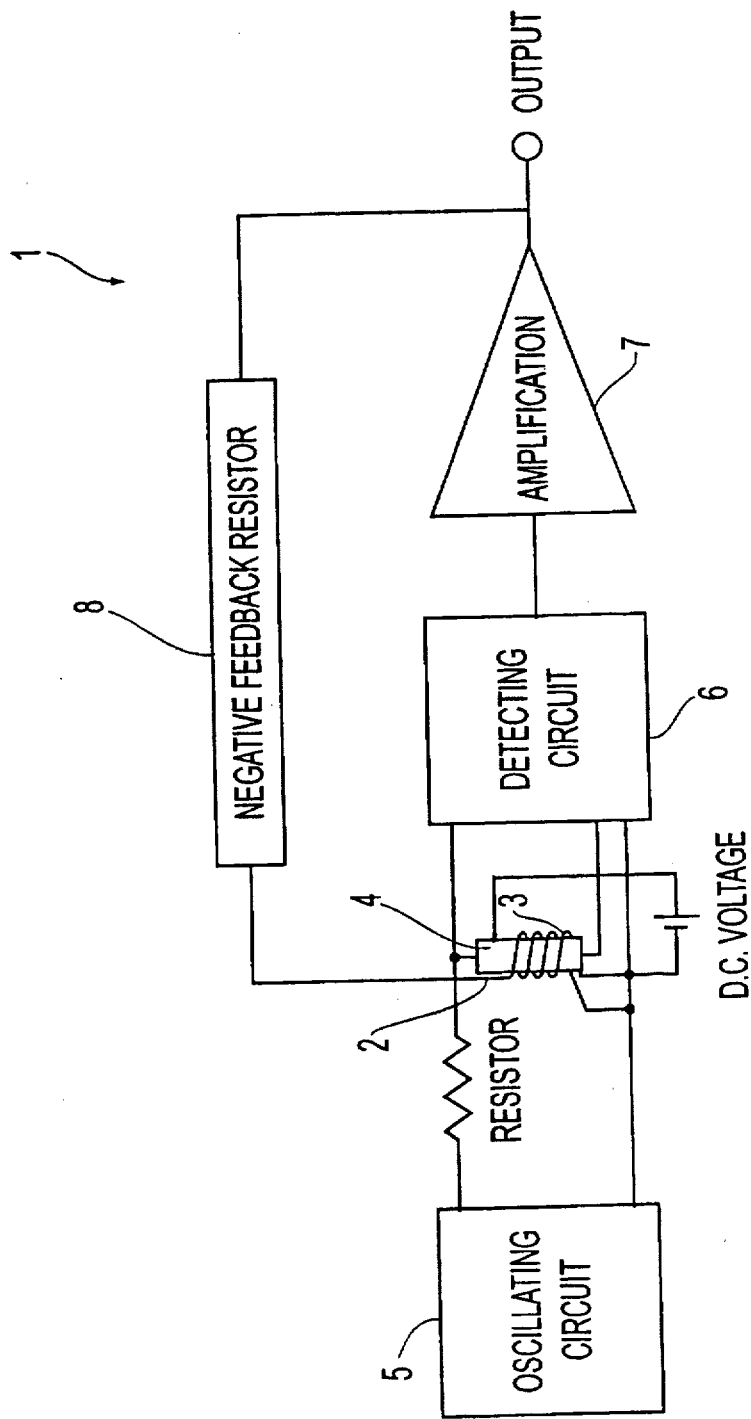
Figure 12:
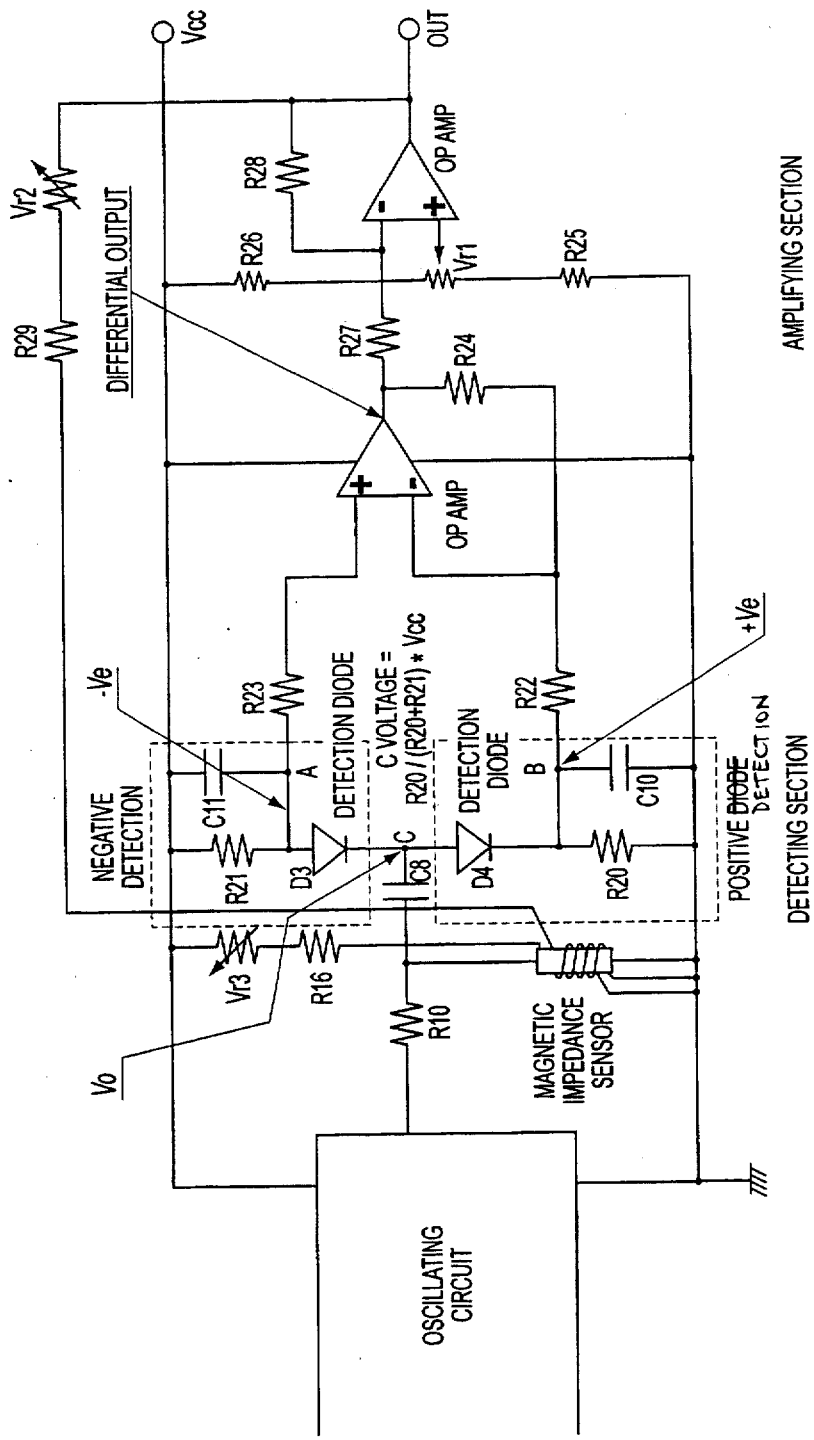
Figure 12:
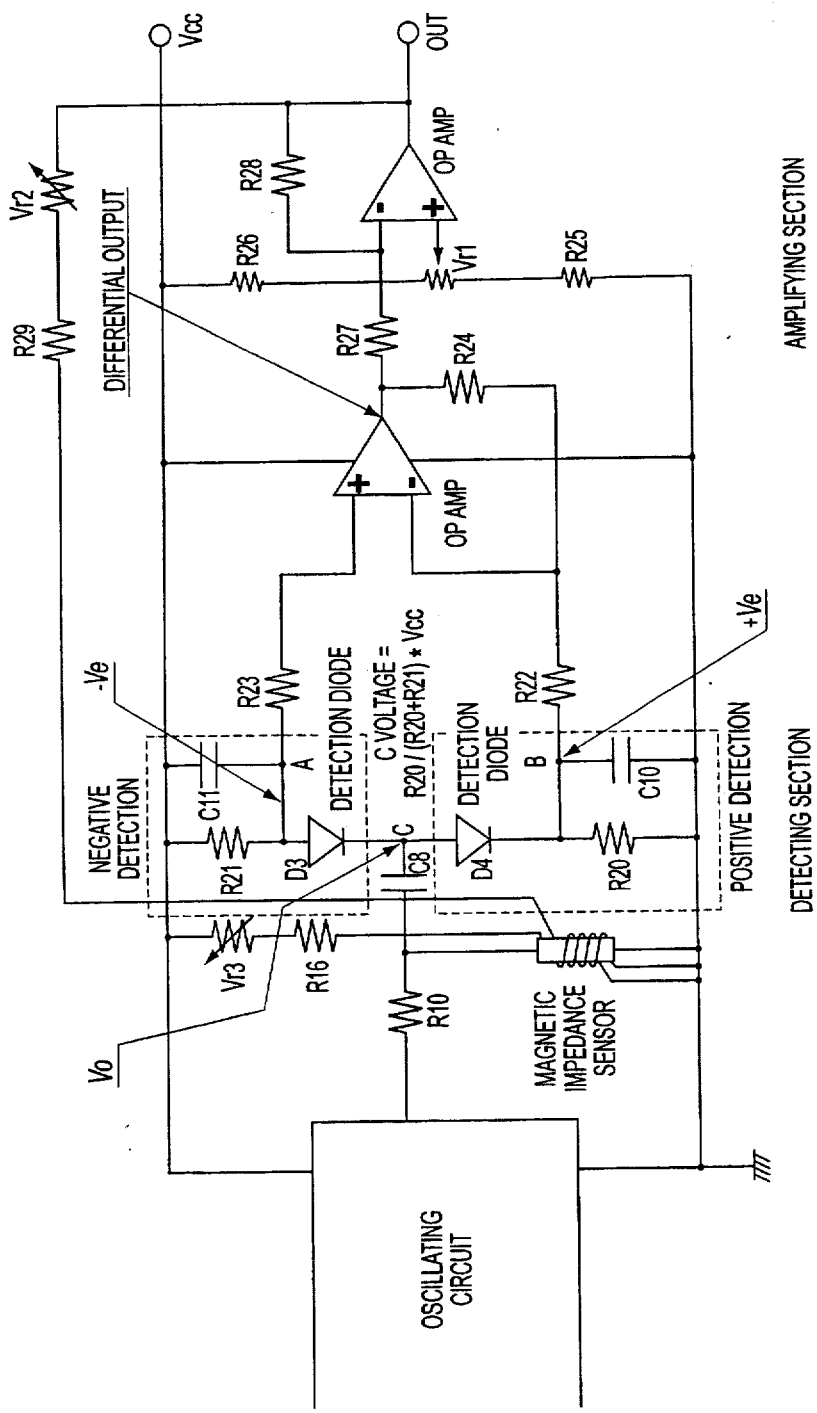
Figure 22:
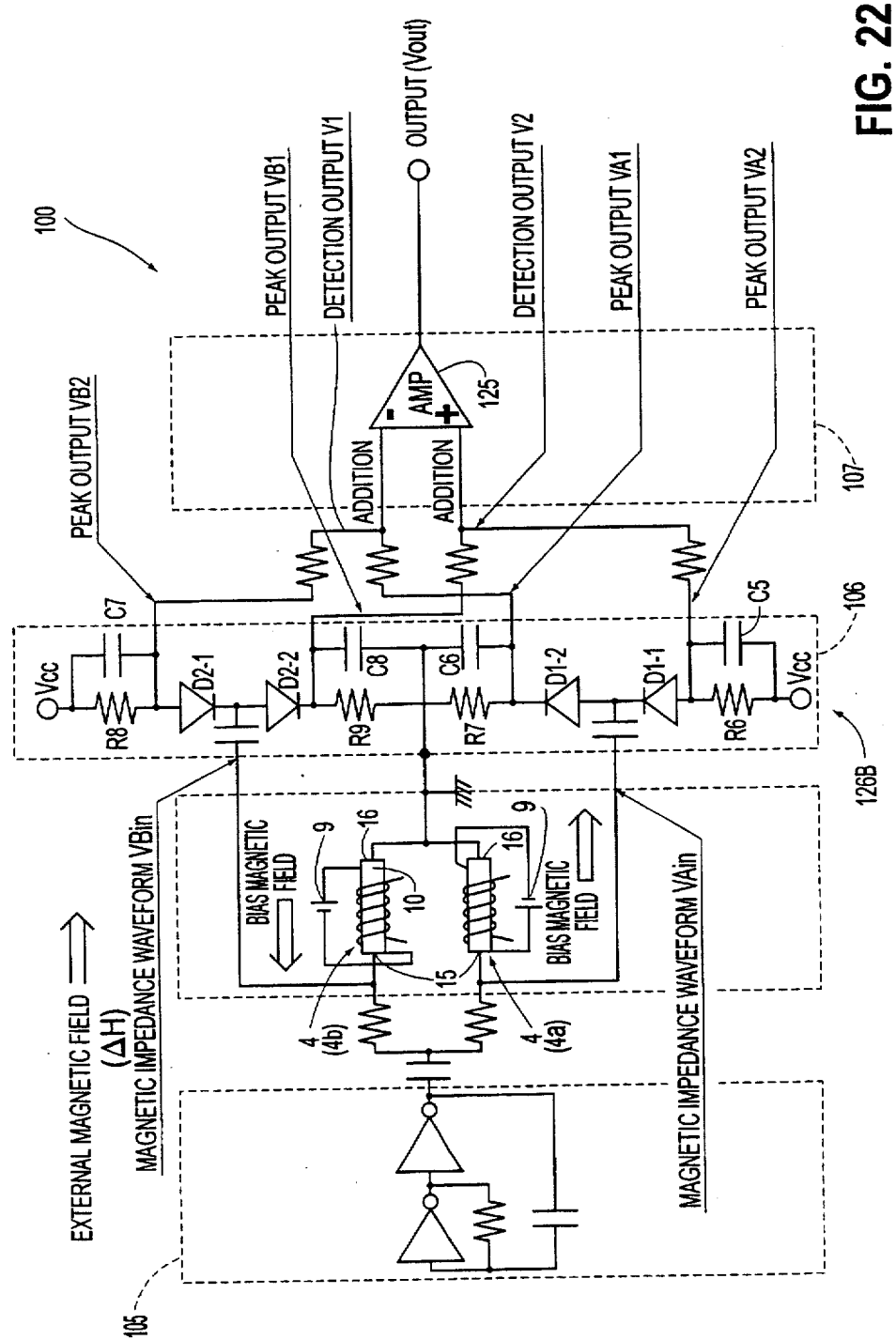
Figure 22:
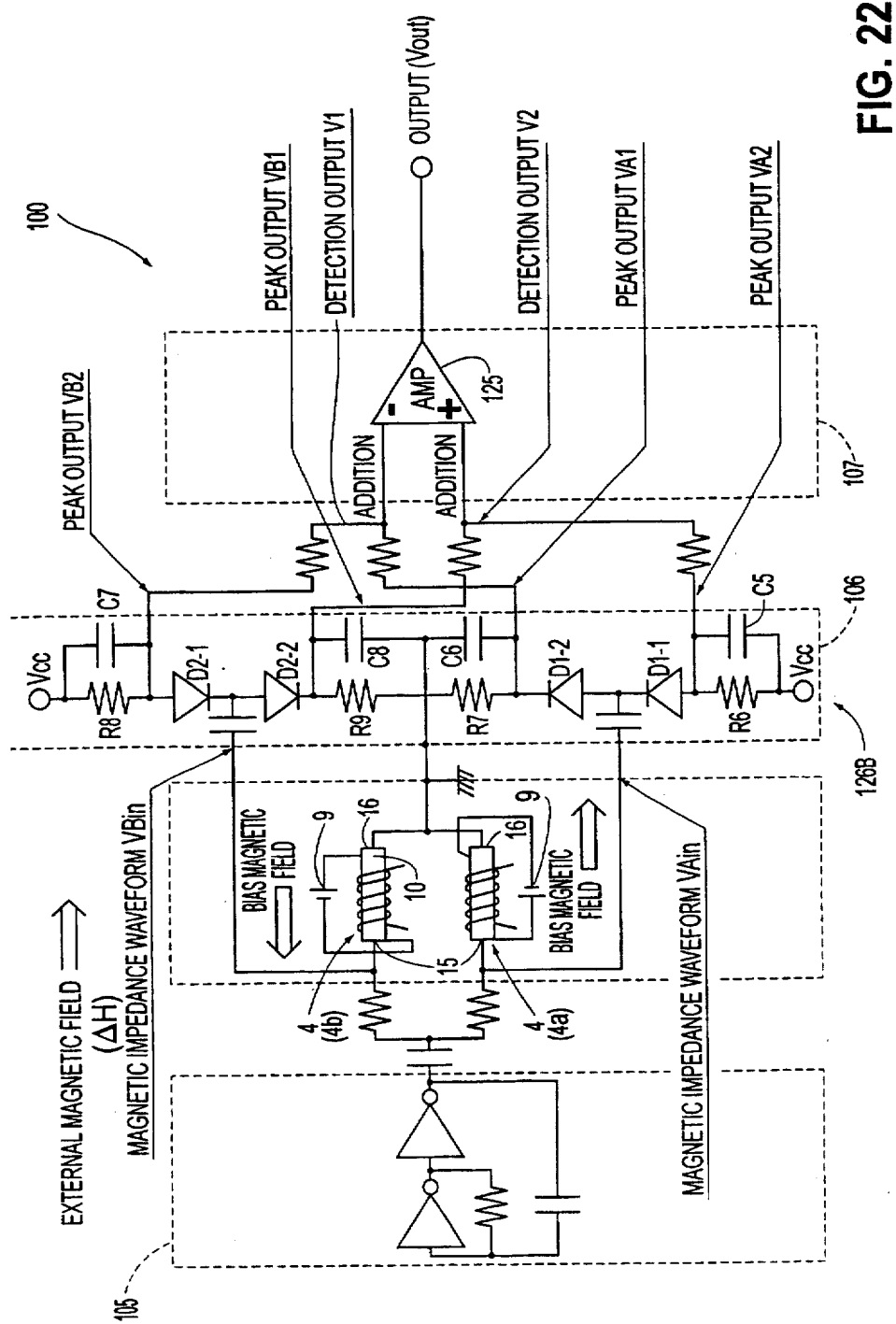
Figure 26:
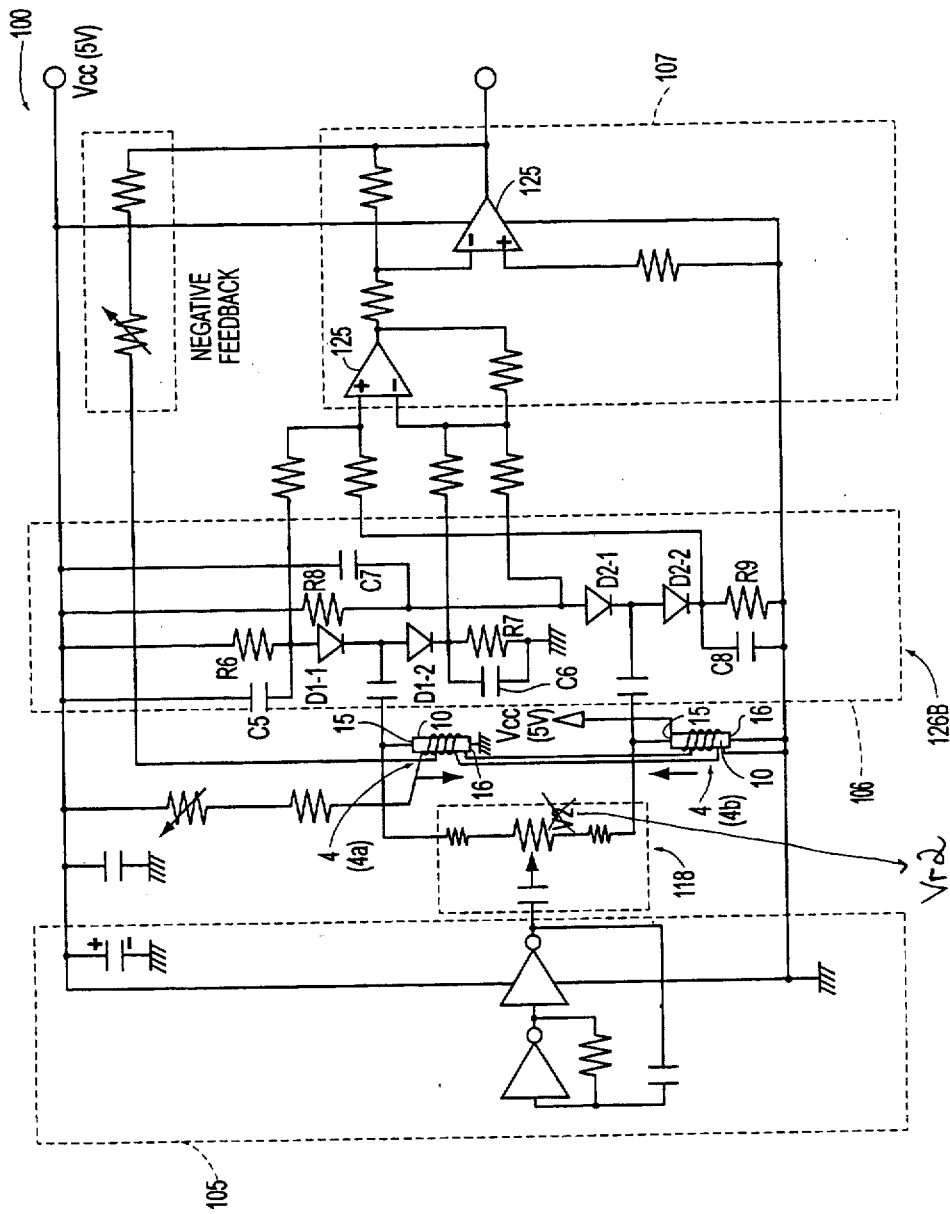
Figure 26:
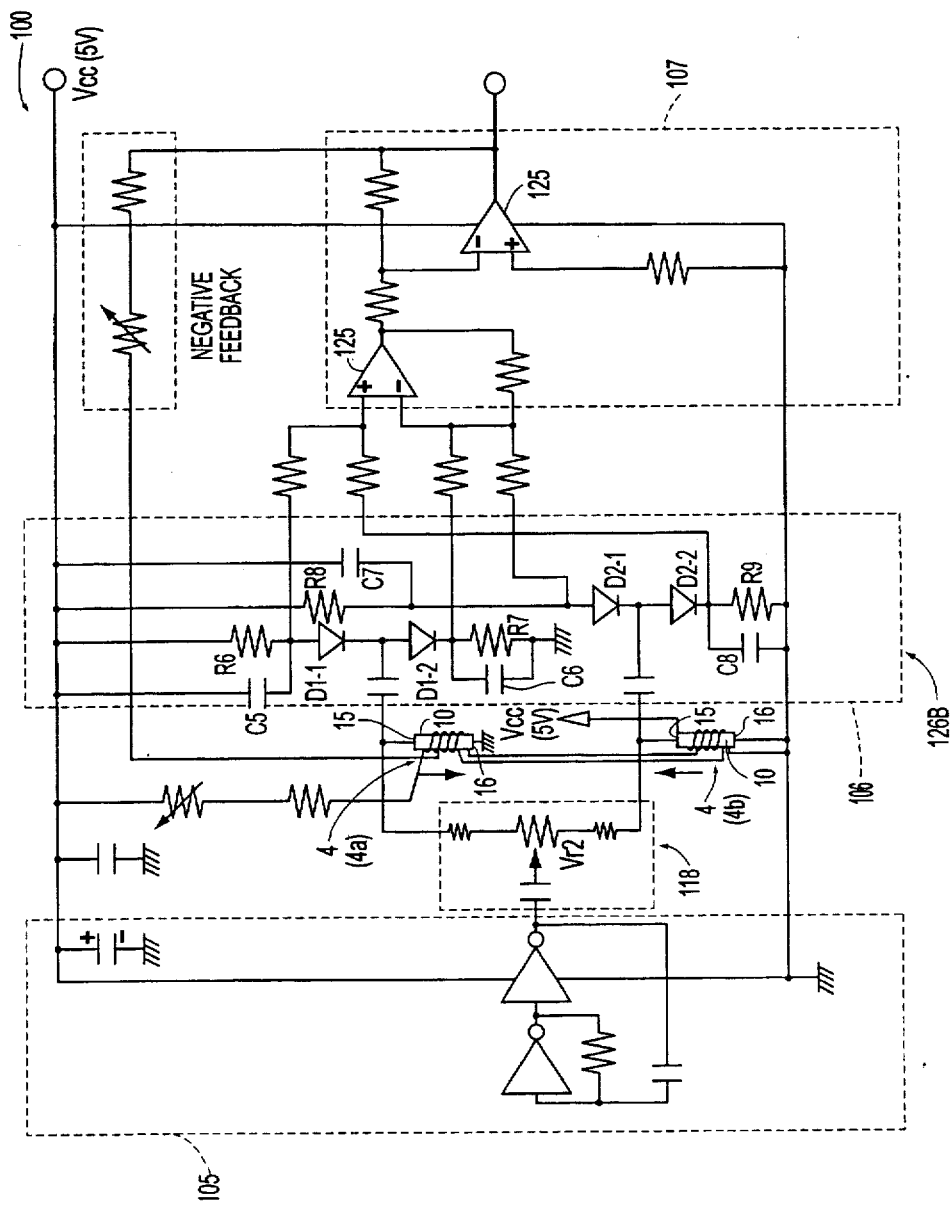
Figure 1:
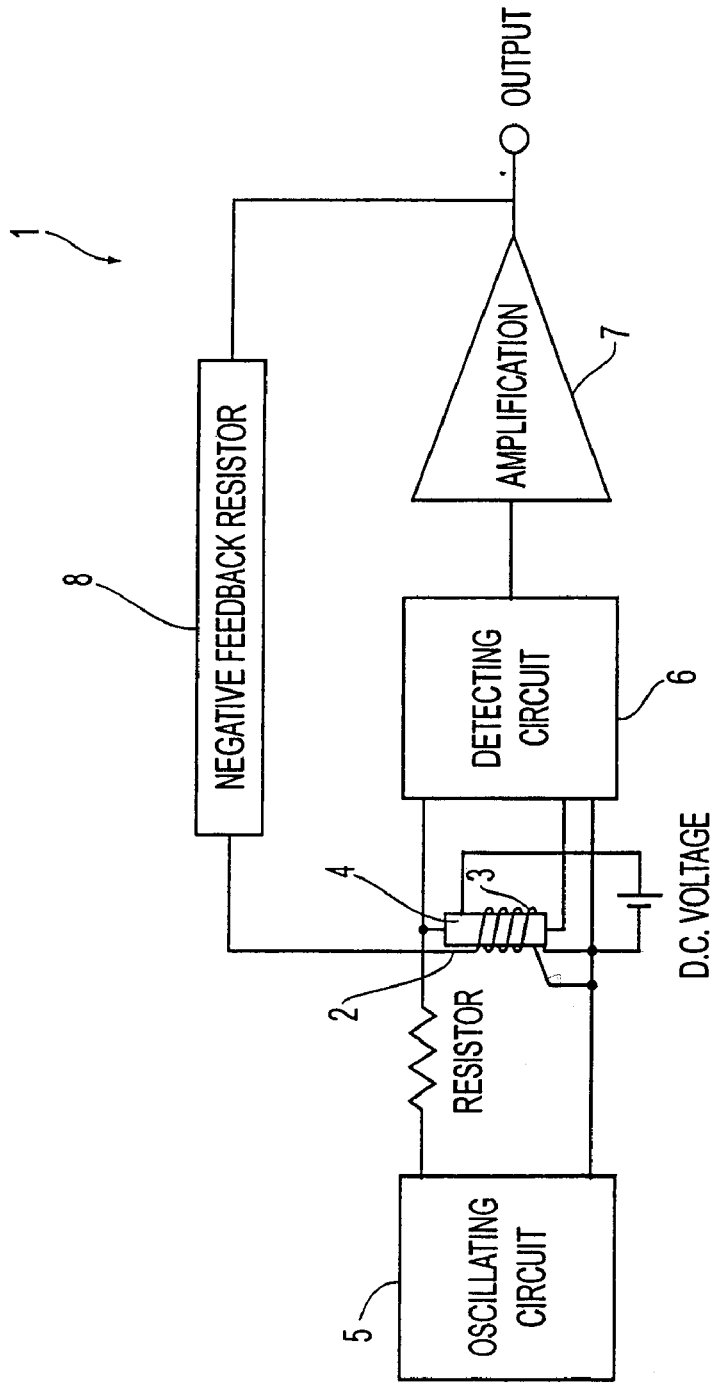
Figure 12:
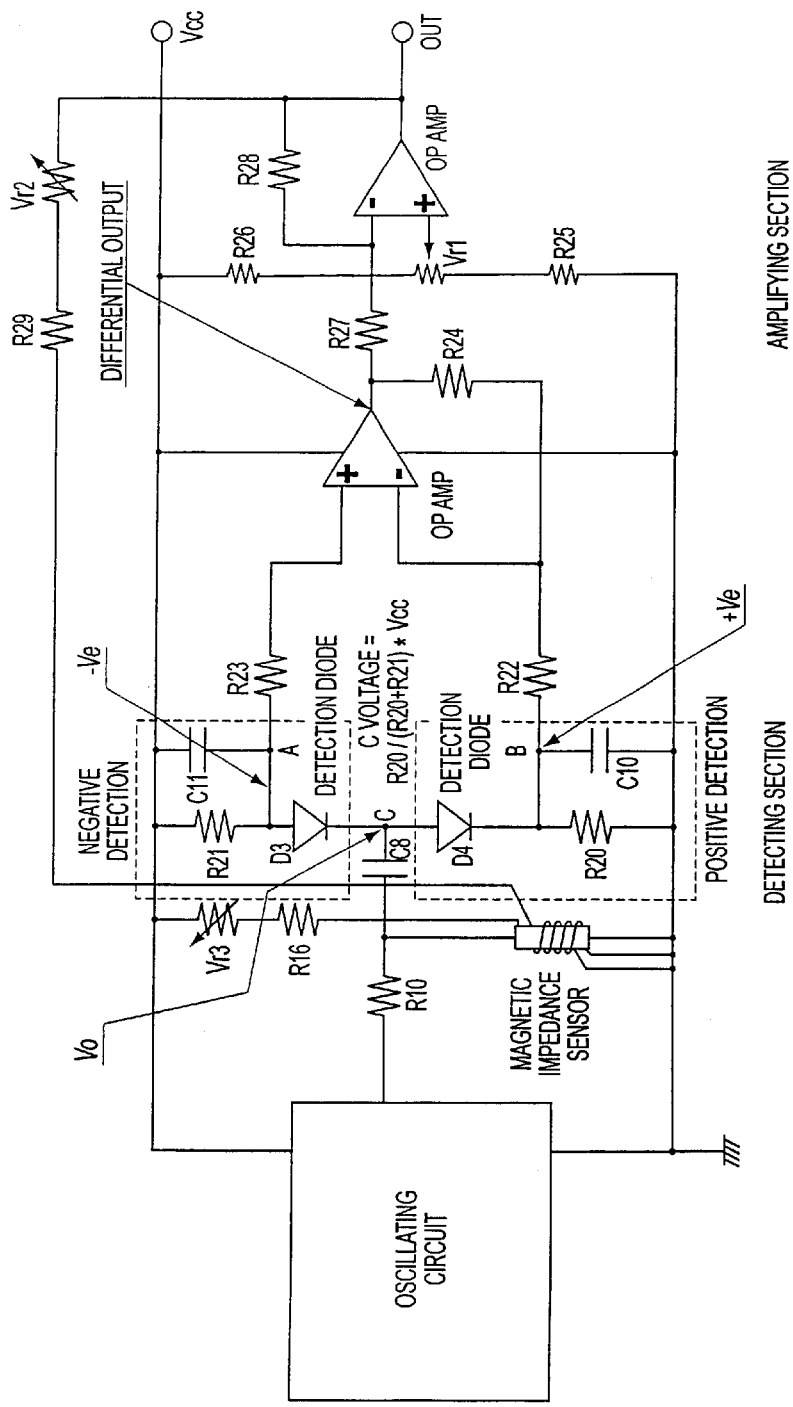
Figure 22:
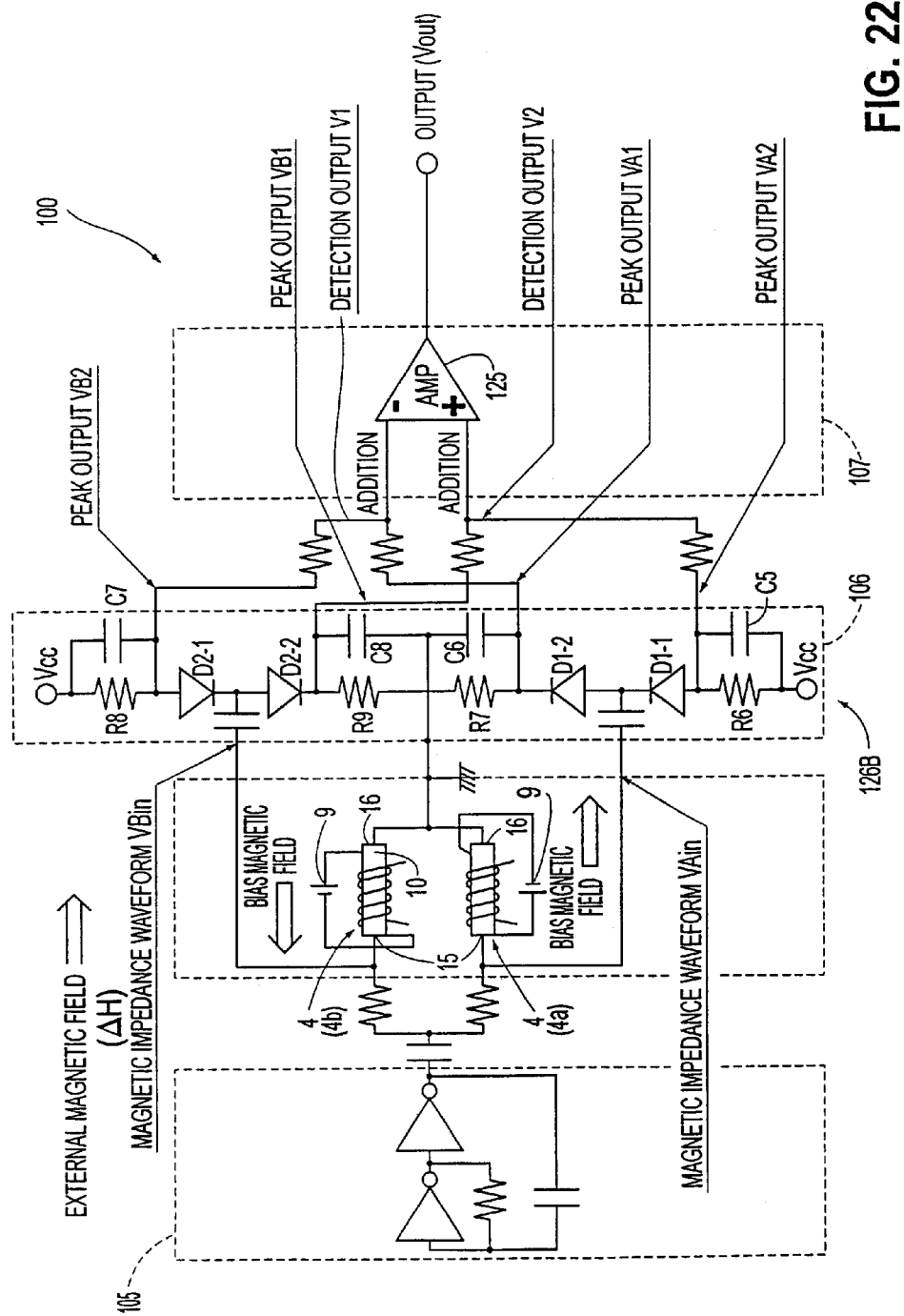
Figure 26:
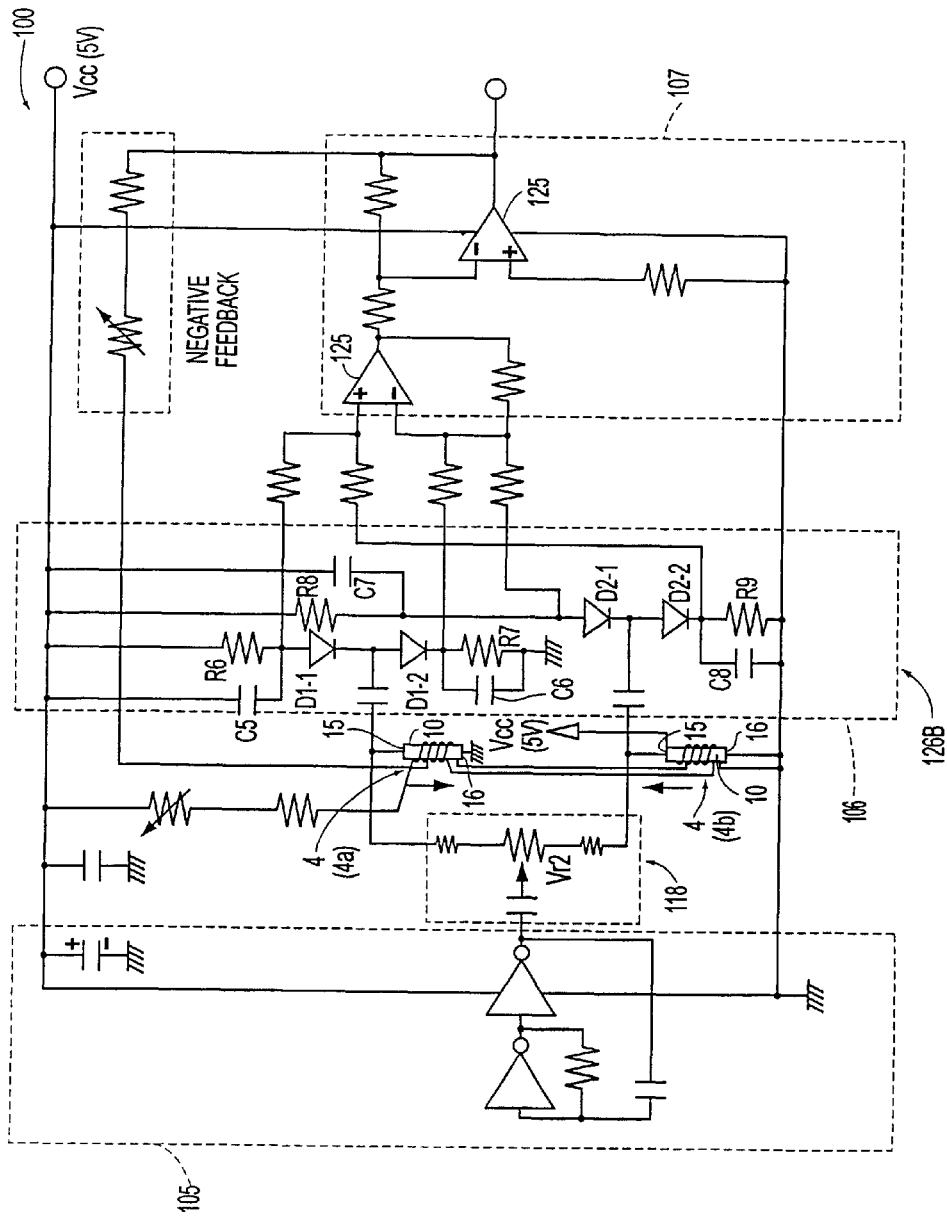
Figure 1:
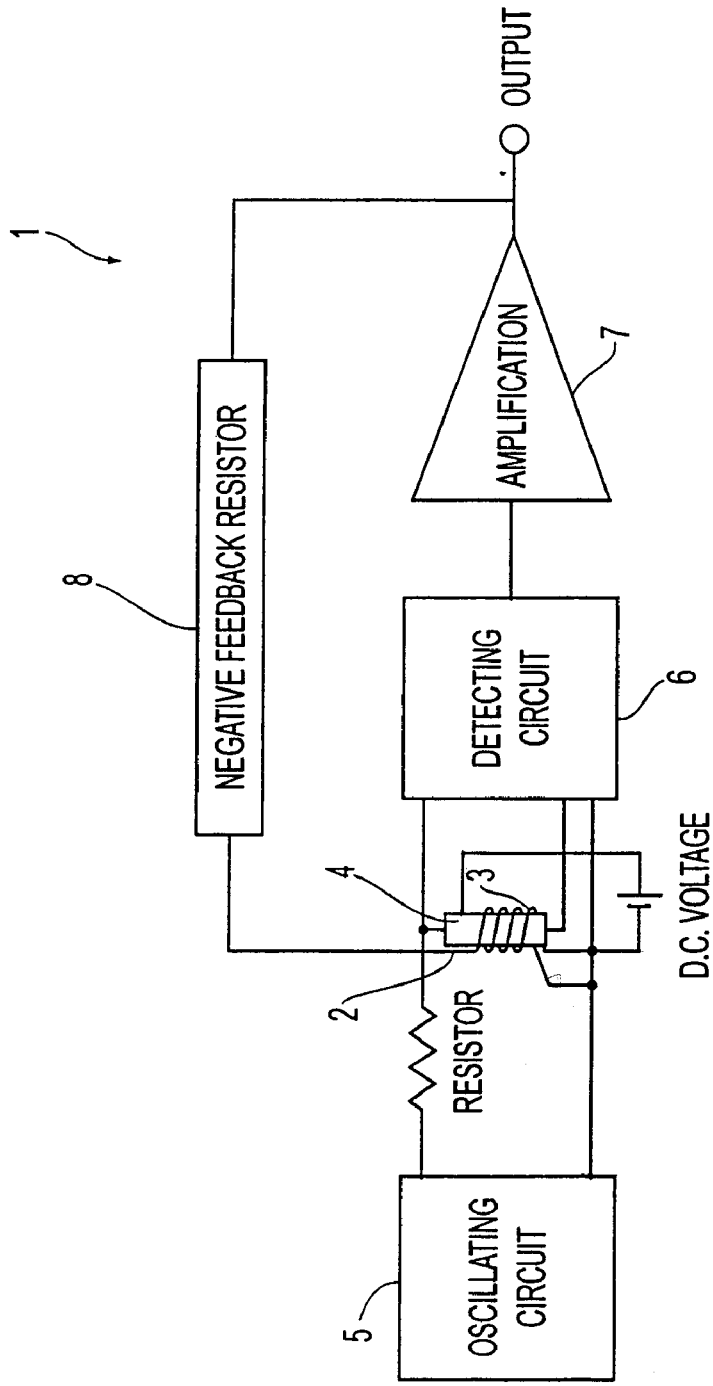
Figure 12:
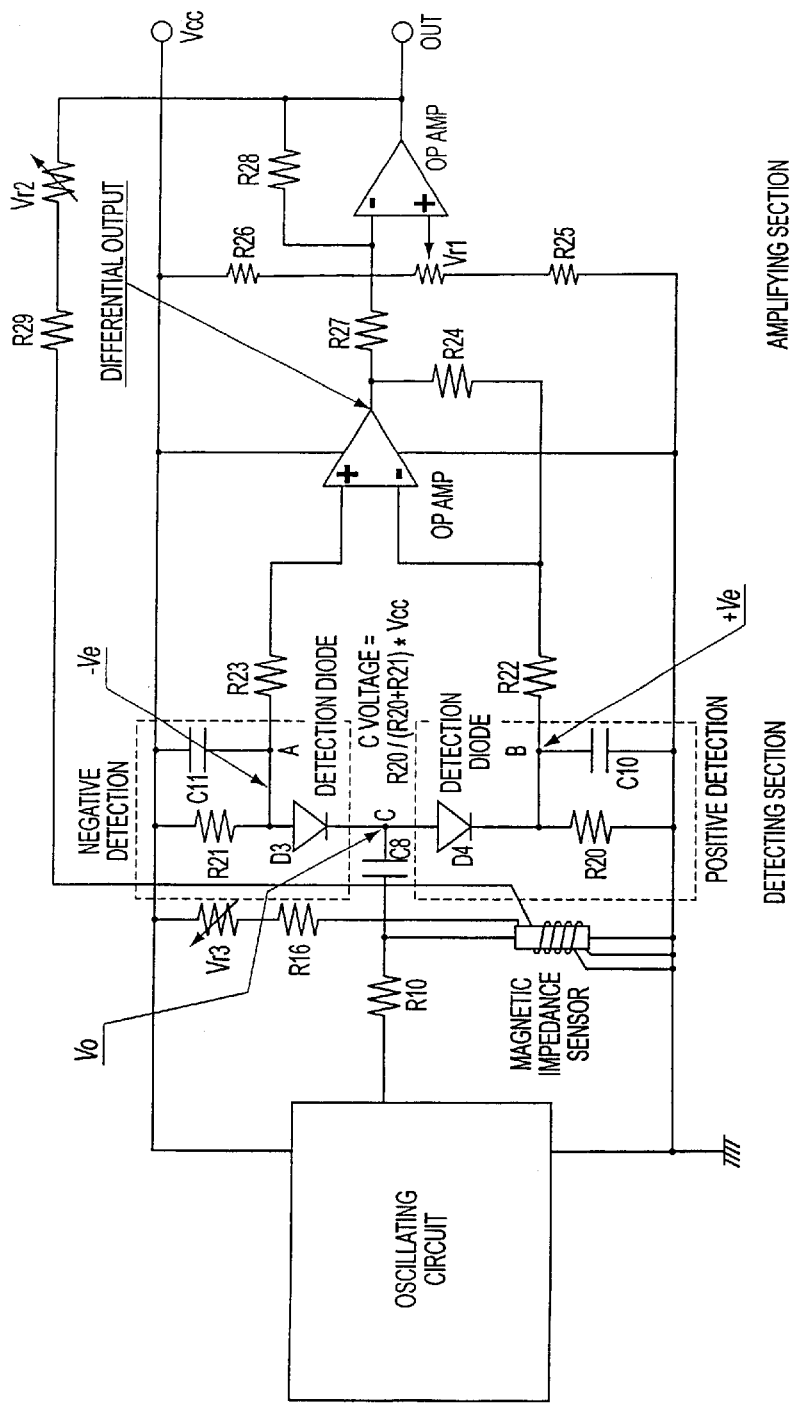
Figure 22:
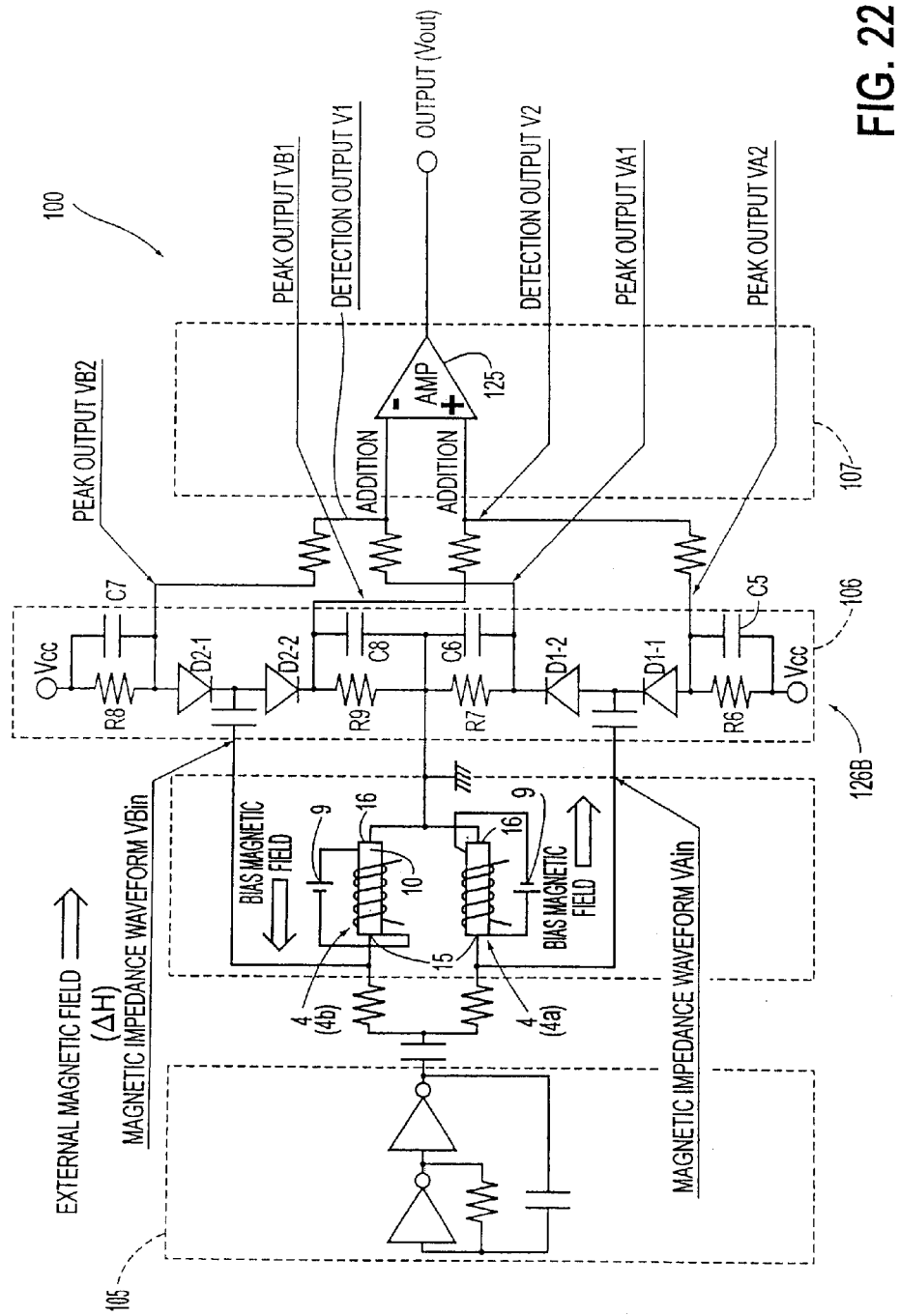
Figure 26:
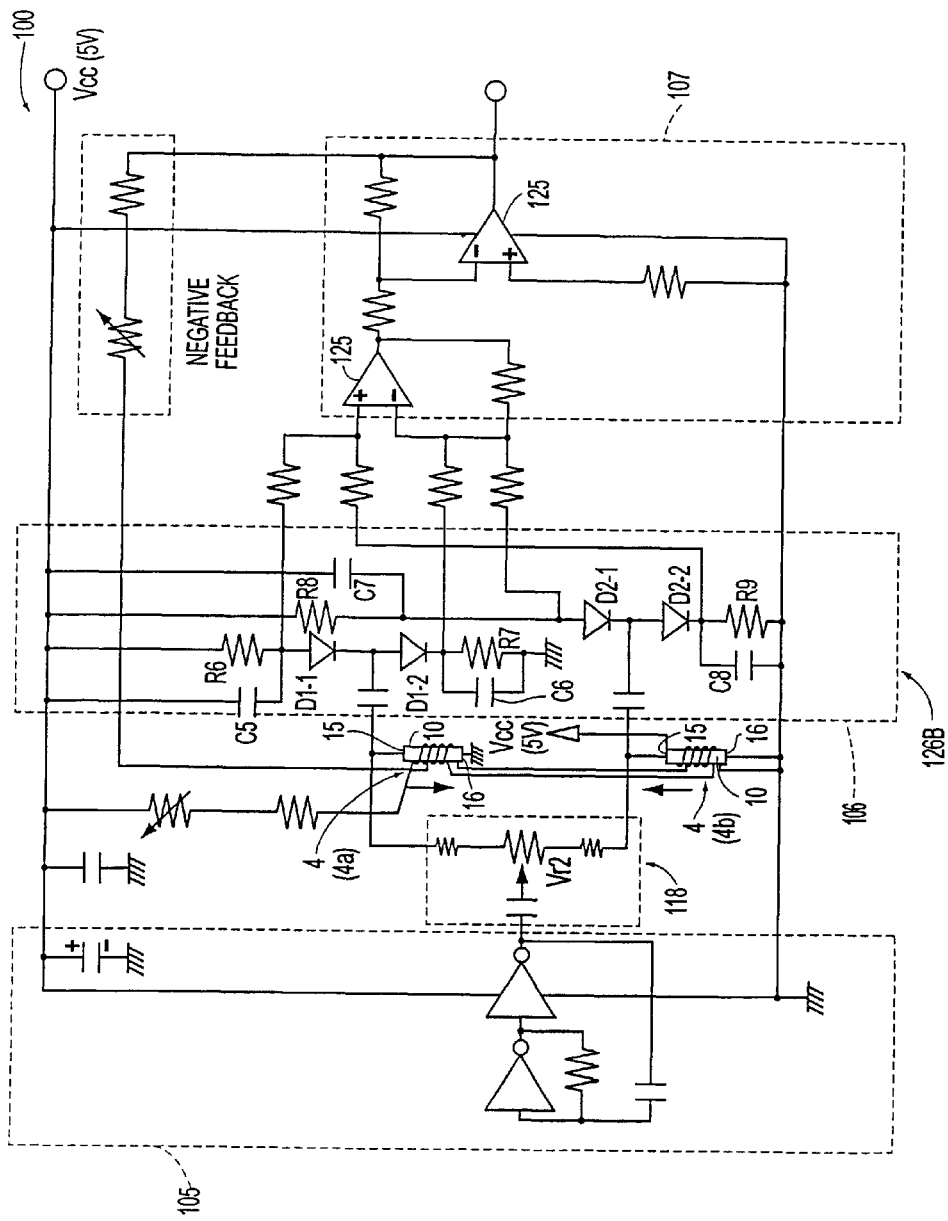

Compared with the detecting circuit 126A shown in FIG. 28, the detecting circuit 128B shown in FIG. 22 uses two detection diodes for each MI element so that both of positive and negative amplitudes of the voltage waveforms between both ends of the MI elements can be detected.

After the voltage waveforms between both ends of the magnetic impedance elements 4 have passed through the diodes D1-1, D1-2, D2-1 and D2-2 (constituting the detecting circuit 106 of the present invention), it is assumed that the peak output of the voltage which has been peak-held at the positive pole side by the first MI element 4a is VA1, and the peak output at the negative pole side is VA2. Also, it is assumed that the positive peak output due to the second MI element 4b is VB1 and the negative peak output is VB2. In this embodiment, resistors R6, R7, RS, R9 and capacitors CB, C6, C7 and C8 constitute a peak hold circuit.

Assuming that the change amount of the voltage which is changed by the external magnetic field is $\Delta$VH, when the external magnetic field is applied, the output is represented by VA1=VA+$\Delta$VH, VA2=−VA−$\Delta$VH, VB1=VB−$\Delta$V7 and VB2=−VB+$\Delta$VH. As shown in the circuit diagram of FIG. 22, VA1 and VB2 of the peak outputs are added together an a detected output V1. Similarly, VA2 and VB1 are added together as a detected output V2. Then, the detected outputs V1 and V2 are differentially detected by the operational amplifier 125 to synthesize four peak outputs. as the result of which the output $V_{out}$ can obtain 4$\Delta$VH through expressions (1) and (2)

$$V_{out}=|\{(VA2+VB1)-(VA1+VB2)\}|+(\tfrac{1}{2})V_{cc}$$

$$=|\{[(-VA-\Delta VH)+(VB-\Delta VH)]-[(VA+\Delta VH)+(-VB+\Delta VH)]\}|+(\tfrac{1}{2})V_{cc} \quad (1)$$

Because VA=VB $$V_{out}=4\Delta VH+(\tfrac{1}{2})V_{cc} \quad (2)$$

Since the detecting circuit 126B shown in FIG. 22 obtains 4VH as its output Vout as described above, as apparent from comparison with the output Vout shown in FIG. 28 (represented by expressions (3) and (4)), it has the detection capability twice as much as that of the detecting circuit 126A shown in FIG. 28.

$$V_{out}=VA+\Delta VH-(VB-\Delta VH) \quad (3)$$

On the other hand, because VA=VB, $$V_{out}=2\Delta VH \quad (4)$$

Also, the detecting circuit 126B shown in FIG. 22 greatly improves its detection sensitivity by allowing a constant current to flow in the diodes, and the power supply of the operational amplifier 125 can be operated by a single power supply.

Figure 24:
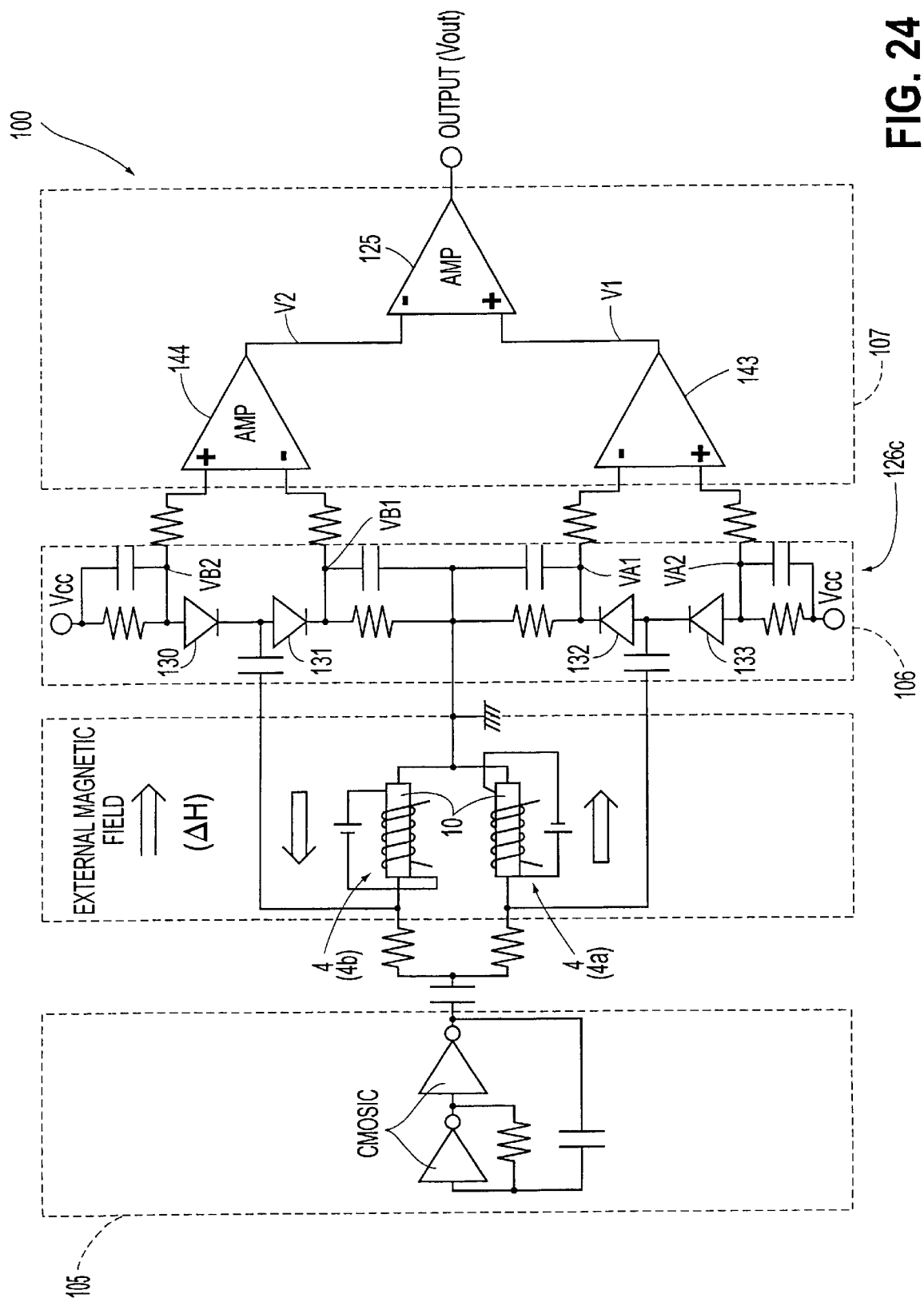
FIG. 24 is a circuit diagram showing another example of the detecting circuit and the amplifying circuit (detecting circuit) shown in FIG. 18.

The detecting circuit 126B shown in FIG. 22 may be replaced by the detecting circuit 126C as shown in FIG. 24. The detecting circuit 126C shown in FIG. 24 is different from the detecting circuit 126B shown in FIG. 22 in that it combines VA1 with VA2, and also VB1 with VB2 with respect to the combinations of the compositions of the peak outputs VA1, VA2, VB1 and VB2, and differentially synthesizes both signal values obtained by those combinations by the operational amplifier. In FIG. 24, reference numeral 143 denotes an operational amplifier that differentially detects VA1 and VA2, and 144 is an operational amplifier that differentially detects VB1 and VB2.

The output $V_{out}$ can detect 4$\Delta$VH as represented by expressions (5) to (8) and has the detection capability equal to that of the detecting circuit 126B shown in FIG. 22.

$$V1=VA2-VA1=(-VA-\Delta VE)-(VA+\Delta VH) \quad (5)$$

$$V2=VB2-VB1=(-VB+\Delta VK)-(VB-\Delta VH) \quad (6)$$

$$V_{out}=|V1-V2|+(1/2)V_{cc}=|(-2VA-2\Delta VH)-(-2VB+2\Delta VH)|+(\tfrac{1}{2})V_{cc} \quad (7)$$

Because VA=VB, $$V_{out}=4\Delta VH+(\tfrac{1}{2})V_{cc} \quad (8)$$

However, the temperature characteristic of the detecting circuit 126C of FIG. 24 as obtained is represented by a dashed line 145 in FIG. 25, and the temperature characteristic of the detecting circuit 126B shown in FIG. 22 (solid line 146) is superior to that of the detecting circuit 126C shown in FIG. 24. Incidentally, the temperature circuit (dotted line 147) of the detecting circuit 126A shown in FIG. 28 is the worst among three detecting circuits 126 (the detecting circuit 126B in FIG. 22, the detecting circuit 126C in FIG. 24 and the detecting circuit 126A in FIG. 28) because the temperature characteristic of the diode appears in the output as it is.

Also, the detecting circuit 126C shown in FIG. 24 uses more operational amplifiers than that used in the detecting circuits 126B shown in FIG. 22, and from this viewpoint, the detecting circuit 126B shown in FIG. 22 is superior to the detecting circuit 126C of FIG. 24.

In FIGS. 22 and 24, the detection diodes 130, 131, 132 and 133 use the Schottky diodes but may use the normal silicon diode in the case where the output of the voltage between both ends of the magnetic impedance element is sufficient.

Figure 26:
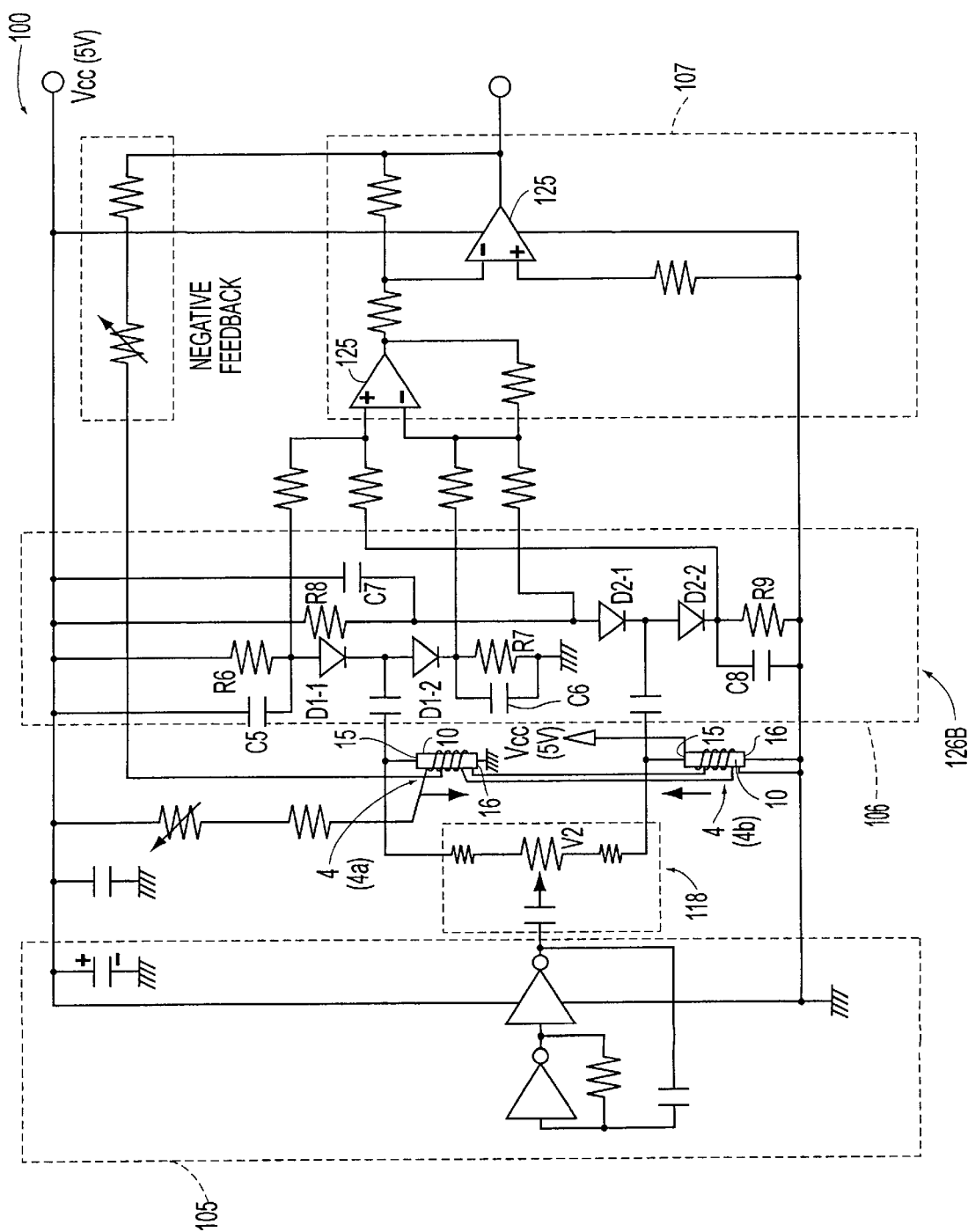
FIG. 26 is a circuit diagram schematically showing the second embodiment of the present invention.
Figure 27:
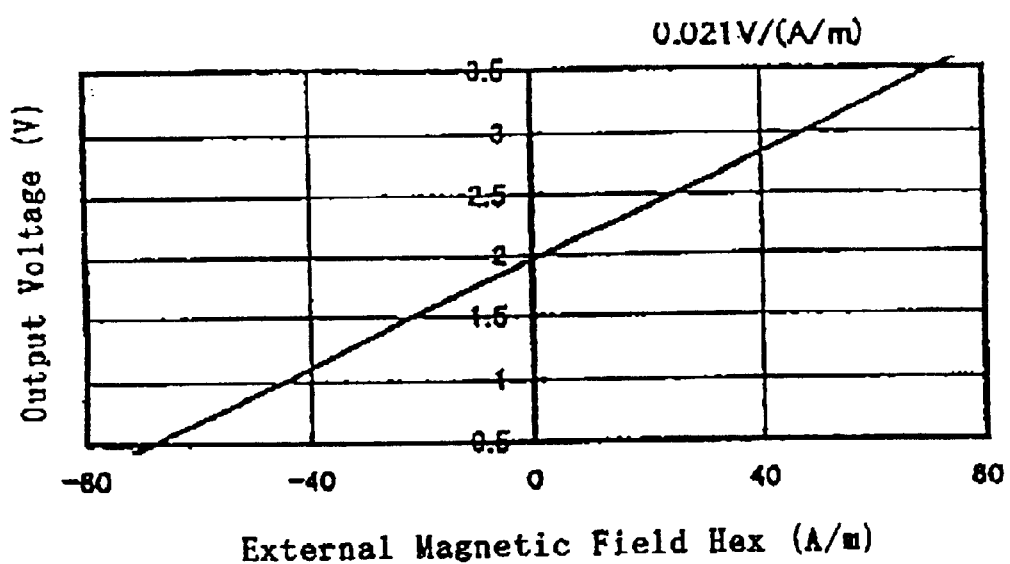
FIG. 27 is a graph showing the external magnetic field to output voltage characteristic of the magnetic sensor shown in FIG. 26.

The second embodiment is directed to the magnetic sensor 1 actually using the detecting circuit 126B shown in FIG. 22, and its circuit structure is shown in FIG. 26. In the second embodiment, the oscillating circuit 105 uses an RC oscillator using C-MS, and a differential waveform is supplied to the MI element by a differentiating circuit 118. The output of the magnetic sensor 100 is shown in FIG. 27.

In the case that a negative feedback 40% in negative feedback under the condition where the magnetic field of the bias coil 3 is 320 A/m, the sensitivity of 0.021 V/(A/m) is obtained within the measured range of ±80 A/m, thus exhibiting an excellent linearity. Those results exhibit the excellent characteristic as the linear magnetic sensor.

The above embodiment show an example in which the ferromagnetic substance of the magnetic impedance element is a ferromagnetic thin-film magnetic core 10, but it may be replaced by a ferromagnetic amorphous wire.

In the invention as claimed in claim 2, a high-frequency current is supplied to two magnetic impedance elements by the oscillator, its output is converted into a DC signal by the detecting circuit and differentially amplified by the amplifier and its output is negatively fed back to a negative feedback coil. The circuit that stably supplies the high-frequency current which is supplied to magnetic impedance element and can efficiently detect the change in magnetic field of the magnetic impedance element can be simply structured. Particularly, the detecting circuit can convert the outputs of the magnetic impedance element into the DC signal with high sensitivity even in the case that an input voltage is low, by allowing the constant current to flow in the diode. Also, since the outputs of the magnetic impedance element are added together and synthesized, there can be provided an excellent magnetic sensor module to remove diode temperature characteristics and change by time-lapse. Then, the module can be operated by a single power supply.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

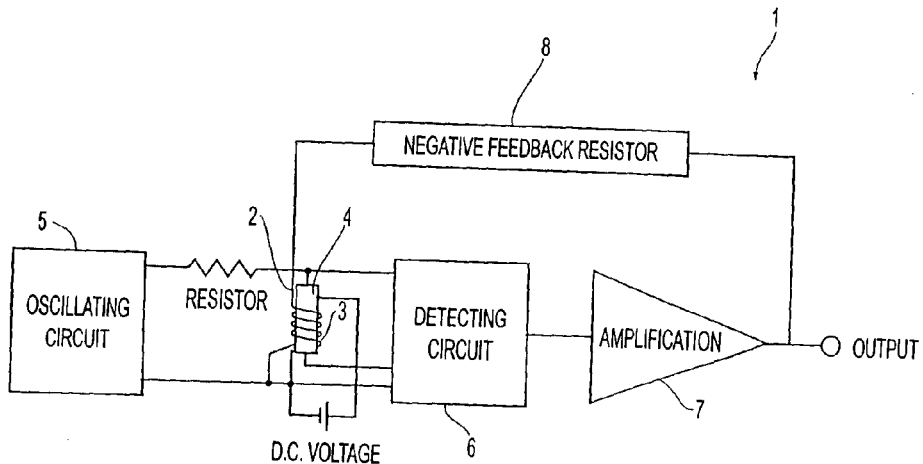

What is claimed is:

1. A magnetic sensor, comprising:

an oscillating circuit for allowing an a.c. magnetic field into a magnetic impedance element made of a ferromagnetic substance, having first and second electrodes on both ends thereof in a longitudinal direction thereof and having a structure in which a bias coil and a negative feedback coil are wound around the ferromagnetic substance through an insulator;

a detecting circuit includes a detection diode detecting an a.c. voltage of said magnetic impedance element due to a change in the impedance of the magnetic impedance element which is caused by an applied external magnetic field;

a peak holding circuit for holding the peak value of the output voltage of said detecting circuit; and an amplifying circuit for differentially amplifying the output of said peak holding circuit;

wherein said detecting circuit allows a constant d.c. current to flow in the detection diode and differentially detects both of the positive side and the negative side of said a.c. voltage.

2. A magnetic sensor, comprising:

two magnetic impedance elements each made of a ferromagnetic substance, having first and second electrodes on both ends thereof in a longitudinal direction thereof and having a structure in which a bias coil and a negative feedback coil are wound around the ferromagnetic substance through an insulator;

an oscillating circuit for allowing an a.c. magnetic field to flow into said two magnetic impedance elements;

a circuit for allowing a d.c. current to the bias coils of said two magnetic impedance elements so that opposite magnetic fields are applied to said two magnetic impedance elements;

a detecting circuit includes a detection diode detecting an a.c. voltage between said first electrode and said second electrode of each of said two magnetic impedance elements due to a change in the impedance of said two magnetic impedance elements which is caused by an applied external magnetic field;

a peak holding circuit for holding the peak value of the output voltage of said detecting circuit; and an amplifying circuit for differentially amplifying the output of said peak holding circuit of said magnetic impedance elements, wherein said detecting circuit allows a constant d.c. current to flow in the detection diode, detects both of the positive side and the negative side of said a.c. voltage, and adds both of the detection outputs together for synthesizing.

3. A magnetic sensor according to claim 1, wherein said magnetic impedance element includes: a substrate formed of a non-magnetic substance; a ferromagnetic thin-film magnetic core formed on said substrate; and first and second electrodes disposed on both ends of said ferromagnetic thin-fila magnetic core in a longitudinal direction thereof;

wherein said bias coil and said negative feedback coil are wound around said ferromagnetic thin film magnetic core through an insulator.

4. A magnetic sensor according to claim 1, wherein said magnetic impedance element includes a ferromagnetic amorphous wire and first and second electrodes disposed on both ends of said ferromagnetic amorphous wire in a longitudinal direction thereof;

wherein said bias coil and said negative feedback coil are wound around said ferromagnetic amorphous wire through an insulator.

5. A magnetic sensor according to claim 1, wherein said oscillating circuit comprises a generator which is formed of a C-MOS and a differentiating circuit and is high in stability.

6. A magnetic sensor according to claim 1, wherein said oscillating circuit comprises a generator which is formed of a C-MOS, an oscillator and a low-pass filter or a band-pass filter and is high in stability.

7. A magnetic sensor according to claim 1, wherein said oscillating circuit comprises a generator which is formed of a Wien's bridge circuit and is high in stability.

8. A magnetic sensor according to claim 1, wherein said oscillating circuit comprises a generator which is formed of a cascode-type Colpitts oscillator made up of a transistor and an oscillator and is high in stability.

9. A magnetic sensor according to claim 2, wherein each of said two magnetic impedance elements include: a substrate formed of a non-magnetic substance; a ferromagnetic thin-film magnetic core formed on said substrate; and first and second electrodes disposed on both ends of said ferromagnetic thin-film magnetic core in a longitudinal direction thereof;

wherein said bias coil and said negative feedback coil are wound around said ferromagnetic thin film magnetic core through an insulator.

10. A magnetic sensor according to claim 2, wherein each of said two magnetic impedance elements include a ferromagnetic amorphous wire and first and second electrodes disposed on both ends of said ferromagnetic amorphous wire in a longitudinal direction thereof;

wherein said bias coil and said negative feedback coil are wound around said ferromagnetic amorphous wire through an insulator.

11. A magnetic sensor according to claim 2, wherein said oscillating circuit comprises a generator which is formed of a C-MOS and a differentiating circuit and is high in stability.

12. A magnetic sensor according to claim 2, wherein said oscillating circuit comprises a generator which is formed of a C-MOS, an oscillator and a low-pass filter or a band-pass filter and is high in stability.

13. A magnetic sensor according to claim 2, wherein said oscillating circuit comprises a generator which is formed of a Wien's bridge circuit and is high in stability.

14. A magnetic sensor according to claim 2, wherein said oscillating circuit comprises a generator which is formed of a cascode-type Colpitts oscillator made up of a transistor and an oscillator and is high in stability.

* * * * *

UNITED STATES PATENT AND TRADEMARK OFFICE
CERTIFICATE OF CORRECTION

PATENT NO. : 6,229,307 B1
DATED : May 8, 2001
INVENTOR(S) : Tamio Umehara; Akio Takayama; Hideki Kato; and Akiyo Yuguchi It is certified that error appears in the above-identified patent and that said Letters Patent is hereby corrected as shown below:

<u>Drawings,</u>
Please substitute the attached Figures 1, 12, 22 and 26 for the drawings in the patent.

Signed and Sealed this

Eighteenth Day of December, 2001

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 6,229,307 B1
DATED        : May 8, 2001
INVENTOR(S)  : Tamio Umehara; Akio Takayama; Hideki Kato; and Akiyo Yuguchi It is certified that error appears in the above-identified patent and that said Letters Patent is hereby corrected as shown below:

Drawings,
Please substitute the attached Figures 1, 12, 22 and 26 for the drawings in the patent.

This certificate supersedes Certificate of Correction issued December 18, 2001.

Signed and Sealed this

Tenth Day of June, 2003

JAMES E. ROGAN
*Director of the United States Patent and Trademark Office*

United States Patent
Umehara et al.

(10) Patent No.: US 6,229,307 B1
(45) Date of Patent: May 8, 2001

(54) MAGNETIC SENSOR

(75) Inventors: Tamio Umehara; Akio Takayama; Hideki Kato; Akiyo Yuguchi, all of Iwata-gun (JP)

(73) Assignee: Minebea Co., Ltd., Nagano-ken (JP)

(*) Notice: Subject to any disclaimer, the term of this patent is extended or adjusted under 35 U.S.C. 154(b) by 0 days.

(21) Appl. No.: 09/372,754

(22) Filed: Aug. 11, 1999

(30) Foreign Application Priority Data

Aug. 12, 1998 (JP) .................................. 10-228451
Mar. 31, 1999 (JP) .................................. 11-091382

(51) Int. Cl.[7] .......................... G01R 33/02; G11B 5/127
(52) U.S. Cl. .......................... 324/249; 324/260; 324/244; 360/110
(58) Field of Search .......................... 324/249, 256, 324/253, 255, 244, 260, 173, 207.13, 235; 360/110

(56) References Cited

U.S. PATENT DOCUMENTS 5,764,055 * 6/1998 Kawase .................................. 324/249
5,831,432 * 11/1998 Mohri .................................. 324/249
5,877,706 * 3/1999 Summersgill .......................... 340/933

FOREIGN PATENT DOCUMENTS

| | | |
|---|---|---|
| 6-176930 | 6/1994 | (JP) |
| 6-347489 | 12/1994 | (JP) . |
| 7-181239 | 7/1995 | (JP) . |
| 7-248365 | 9/1995 | (JP) . |
| 7-333305 | 12/1995 | (JP) . |
| 8-75835 | 3/1996 | (JP) . |
| 11014643 | * 6/1997 | (JP) . |

OTHER PUBLICATIONS

T. Morikawa et al. "Thin–Film GMI Elements with High Sensitivity" Japanese Applied Magnetic Institute Journal, vol. 20, No. 2, 1996, pp. 553–556.

T. Gunji et al. "Asymmetrical Magneto–Impedance Effect in an Amorphous Wire with a Coil" Japan Applied Magnetic Society, vol. 21, No. 4–2, 1997, pp. 793–796.

* cited by examiner

*Primary Examiner*—Christine Oda
*Assistant Examiner*—Anthony Jolly
(74) *Attorney, Agent, or Firm*—Oliff & Berridge, PLC

(57) ABSTRACT

A magnetic sensor includes: an oscillating circuit for allowing an a.c. magnetic field into a magnetic impedance element made of a ferromagnetic substance, having first and second electrodes on both ends thereof in a longitudinal direction thereof and having a structure in which a bias coil and a negative feedback coil are wound around the ferromagnetic substance through an insulator; a detecting circuit for detecting an a.c. voltage of the magnetic impedance element due to a change in the impedance of the magnetic impedance element which is caused by an applied external magnetic field; a peak holding circuit for holding the peak value of the output voltage of the detecting circuit; and an amplifying circuit for differentially amplifying the output of the peak holding circuit.

14 Claims, 26 Drawing Sheets

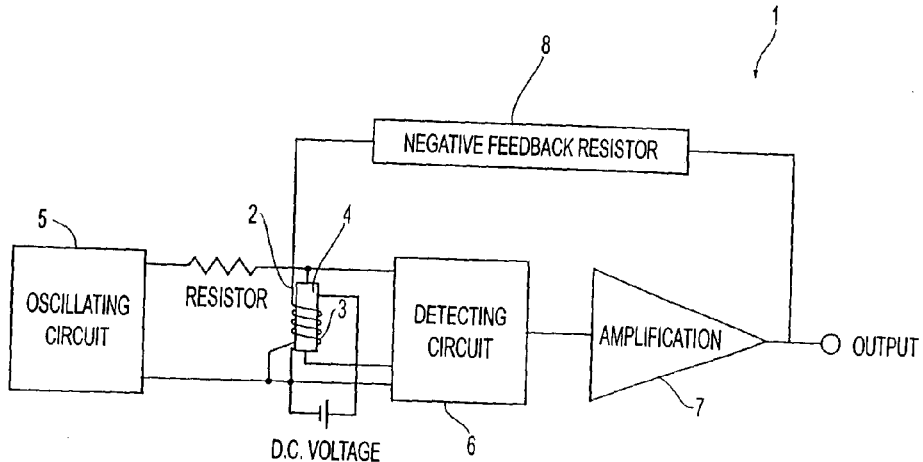

UNITED STATES PATENT AND TRADEMARK OFFICE
CERTIFICATE OF CORRECTION

PATENT NO.    : 6,229,307 B1
DATED         : May 8, 2001
INVENTOR(S)   : Tamio Umehara; Akio Takayama; Hideki Kato; and Akiyo Yuguchi It is certified that error appears in the above-identified patent and that said Letters Patent is hereby corrected as shown below:

Please delete Title page and substitute the attached Title page therefor.

<u>Drawings</u>,
Please substitute the attached Figures 1, 12, 22 and 26 for the drawings in the patent.

This certificate supersedes Certificate of Correction issued June 10, 2003.

Signed and Sealed this

Twentieth Day of January, 2004

JON W. DUDAS
*Acting Director of the United States Patent and Trademark Office*

(12) United States Patent
Umehara et al.

(10) Patent No.: US 6,229,307 B1
(45) Date of Patent: May 8, 2001

(54) MAGNETIC SENSOR

(75) Inventors: Tamio Umehara; Akio Takayama; Hideki Kato; Akiyo Yuguchi, all of Iwata-gun (JP)

(73) Assignee: Minebea Co., Ltd., Nagano-ken (JP)

(*) Notice: Subject to any disclaimer, the term of this patent is extended or adjusted under 35 U.S.C. 154(b) by 0 days.

(21) Appl. No.: 09/372,754

(22) Filed: Aug. 11, 1999

(30) Foreign Application Priority Data

Aug. 12, 1998 (JP) .................................. 10-228451
Mar. 31, 1999 (JP) .................................. 11-091382

(51) Int. Cl.[7] ........................... G01R 33/02; G11B 5/127
(52) U.S. Cl. ..................... 324/249; 324/260; 324/244; 360/110
(58) Field of Search ..................... 324/249, 256, 324/253, 255, 244, 260, 173, 207.13, 235; 360/110

(56) References Cited

U.S. PATENT DOCUMENTS 5,764,055 * 6/1998 Kawase ........................ 324/249
5,831,432 * 11/1998 Mohri ........................... 324/249
5,877,706 * 3/1999 Summersgill ................. 340/933

FOREIGN PATENT DOCUMENTS 6-176930   6/1994 (JP)
6-347489  12/1994 (JP) .
7-181239   7/1995 (JP) .
7-248365   9/1995 (JP) .
7-333305  12/1995 (JP) .
8-75835    3/1996 (JP) .
11014643 * 6/1997 (JP) .

OTHER PUBLICATIONS

T. Morikawa et al. "Thin–Film GMI Elements with High Sensitivity" Japanese Applied Magnetic Institute Journal, vol. 20, No. 2, 1996, pp. 553–556.
T. Gunji et al. "Asymmetrical Magneto–Impedance Effect in an Amorphous Wire with a Coil" Japan Applied Magnetic Society, vol. 21, No. 4–2, 1997, pp. 793–796.

* cited by examiner

Primary Examiner—Christine Oda
Assistant Examiner—Anthony Jolly
(74) Attorney, Agent, or Firm—Oliff & Berridge, PLC

(57) ABSTRACT

A magnetic sensor includes: an oscillating circuit for allowing an a.c. magnetic field into a magnetic impedance element made of a ferromagnetic substance, having first and second electrodes on both ends thereof in a longitudinal direction thereof and having a structure in which a bias coil and a negative feedback coil are wound around the ferromagnetic substance through an insulator; a detecting circuit for detecting an a.c. voltage of the magnetic impedance element due to a change in the impedance of the magnetic impedance element which is caused by an applied external magnetic field; a peak holding circuit for holding the peak value of the output voltage of the detecting circuit; and an amplifying circuit for differentially amplifying the output of the peak holding circuit.

14 Claims, 26 Drawing Sheets